US011645959B2

(12) United States Patent
Lee et al.

(10) Patent No.: US 11,645,959 B2
(45) Date of Patent: *May 9, 2023

(54) DISPLAY DEVICE AND INSPECTING METHOD THEREOF

(71) Applicant: Samsung Display Co., Ltd., Yongin-Si (KR)

(72) Inventors: Kwang Sae Lee, Asan-si (KR); Won Kyu Kwak, Seongnam-si (KR); Ji-Hyun Ka, Seongnam-si (KR); Gyeong Nam Bang, Seoul (KR); Ki Myeong Eom, Suwon-si (KR)

(73) Assignee: Samsung Display Co., Ltd., Gyeonggi-Do Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/570,610

(22) Filed: Jan. 7, 2022

(65) Prior Publication Data
US 2022/0130302 A1   Apr. 28, 2022

Related U.S. Application Data

(63) Continuation of application No. 16/685,076, filed on Nov. 15, 2019, now Pat. No. 11,250,745.

(30) Foreign Application Priority Data

Nov. 15, 2018 (KR) .................. 10-2018-0140834

(51) Int. Cl.
G01R 31/26     (2020.01)
G09G 3/00      (2006.01)
(Continued)

(52) U.S. Cl.
CPC ......... *G09G 3/006* (2013.01); *G01R 31/2632* (2013.01); *G01R 31/2837* (2013.01);
(Continued)

(58) Field of Classification Search
CPC ............ G01R 31/2837; G01R 31/2822; G01R 31/2825; G01R 31/2884; G01R 31/2886;
(Continued)

(56) References Cited

U.S. PATENT DOCUMENTS 10,522,431 B2  12/2019 Kim et al.
11,011,085 B2   5/2021 Lee et al.
(Continued)

FOREIGN PATENT DOCUMENTS

CN  108932921 A  12/2018
CN  109979366 A   7/2019
(Continued)

OTHER PUBLICATIONS

Extended European Search Report, Application No. 19209264.1, dated Mar. 9, 2020, 14 pages.

*Primary Examiner* — Thang X Le
(74) *Attorney, Agent, or Firm* — Innovation Counsel LLP

(57) ABSTRACT

An exemplary embodiment of the present inventive concept provides a display device including: a display area where an image is displayed; a peripheral area disposed outside the display area; a hole area disposed within the display area; a hole crack detection line disposed adjacent to the hole area to surround the hole area and having a first end and a second end that is separated from the first end; a first detection line extending from the peripheral area and connected to the hole crack detection line to constitute a first closed circuit; a second detection line extending from the peripheral area and connected to the hole crack detection line to constitute a second closed circuit; and a circuit portion connected to the first detection line and the second detection line.

20 Claims, 18 Drawing Sheets

(51) Int. Cl.
    *G01R 31/28*     (2006.01)
    *H01L 27/32*     (2006.01)
    *H01L 51/00*     (2006.01)

(52) U.S. Cl.
    CPC ...... H01L 27/3276 (2013.01); H01L 51/0097 (2013.01); *G09G 2380/02* (2013.01)

(58) Field of Classification Search
    CPC ............ G01R 31/2889; G01R 31/3025; G01R 31/31723; G01R 31/3641; G01R 29/0814; G01R 29/0878; G01R 29/26; G09G 3/006; G09G 3/20; G09G 3/2003; G09G 3/3225; G09G 2330/06; G09G 2330/10; G09G 2330/028; G09G 2330/12; G02F 1/0121; G02F 1/1309; G02F 1/13452
    See application file for complete search history.

(56) References Cited

U.S. PATENT DOCUMENTS

| | | |
|---|---|---|
| 2013/0082843 A1 | 4/2013 | Wurzel et al. |
| 2016/0140896 A1* | 5/2016 | Kwon ................... G09G 3/3225 345/76 |
| 2016/0232826 A1* | 8/2016 | Cho ....................... G09G 3/006 |
| 2016/0322451 A1 | 11/2016 | Park |
| 2017/0162637 A1 | 6/2017 | Choi et al. |
| 2017/0199439 A1 | 7/2017 | Jia et al. |
| 2017/0270842 A1* | 9/2017 | Nam ....................... G09G 3/006 |
| 2018/0033355 A1 | 2/2018 | Lee et al. |
| 2018/0053466 A1 | 2/2018 | Zhang et al. |
| 2018/0158741 A1 | 6/2018 | Kim et al. |
| 2018/0174505 A1* | 6/2018 | Mandlik ............. H01L 27/3276 |
| 2018/0342185 A1 | 11/2018 | Lee et al. |
| 2021/0175463 A1* | 6/2021 | Zhou ...................... G02F 1/1339 |
| 2021/0272490 A1 | 9/2021 | Lee et al. |

FOREIGN PATENT DOCUMENTS

| | | |
|---|---|---|
| CN | 110264891 A | 9/2019 |
| EP | 3276595 A2 | 1/2018 |
| EP | 3330951 A2 | 6/2018 |
| JP | 6219177 B2 | 10/2017 |
| KR | 10-0736279 B1 | 7/2007 |
| KR | 10-2016-0017845 A | 2/2016 |
| KR | 10-2017-0019553 A | 2/2017 |

* cited by examiner

DISPLAY DEVICE AND INSPECTING METHOD THEREOF

CROSS-REFERENCE TO RELATED APPLICATION

This application is a continuation application of U.S. patent application Ser. No. 16/685,076 filed on Nov. 15, 2019, which claims priority to and benefits of Korean Patent Application No. 10-2018-0140834 filed in the Korean Intellectual Property Office on Nov. 15, 2018, the entire contents of which are incorporated herein by reference.

BACKGROUND

(a) Field

Embodiments of the present inventive concept relates to a display device and an inspecting method thereof, and more particularly to a display device including a display panel having a hole formed therein and an inspecting method thereof.

(b) Description of the Related Art

A display device such as a liquid crystal display (LCD) or an organic light emitting diode display (OLED) display includes a display panel including a plurality of pixels capable of displaying an image and a plurality of signal lines. Each pixel may include a pixel electrode for receiving a data signal, and the pixel electrode may be connected to at least one transistor to receive a data signal. The display panel may include a plurality of layers that are stacked therein.

When a display panel is impacted, cracks may be formed on a substrate or on the layers stacked thereon. The cracks may grow over time or spread to other layers or other regions, which can lead to poor display panel quality. For example, a signal line such as a data line or a gate line may be disconnected by the cracks or may increase in resistance, and moisture may penetrate into the display panel through the cracks, thereby reducing element reliability. As a result, various problems such as pixels of the display panel not emitting light, erroneously emitting light, and the like may occur.

In particular, recently developed flexible displays may be curved or bent during manufacture or use, and even when minute cracks are present in the substrate or stacked layers of the display panel, the minute cracks may develop into larger cracks due to curving or bending of the display panel.

The above information disclosed in this Background section is only for enhancement of understanding of the background of the inventive concept and therefore it may contain information that does not form the prior art that is already known in this country to a person of ordinary skill in the art.

SUMMARY

Devices such as a camera, a flash, a speaker, and an optical sensor, which are disposed in a non-display area, may be disposed in a display area in order to minimize the non-display area on a front surface of the display device and to maximize the display area to the entire front surface. For example, a hole can be formed in a display panel by punching, and a camera, a flash, a speaker, a photosensor, etc. may be mounted in the hole. Cracks may occur during a process of forming the hole in the display panel, or cracks may occur in a portion exposed by the hole.

The present inventive concept has been made in an effort to provide a display device, and an inspecting method thereof, capable of testing cracks which may occur in a display panel having a hole formed therein.

An exemplary embodiment of the present inventive concept provides a display device including: a display area where an image is displayed; a peripheral area disposed outside the display area; a hole area disposed within the display area; a hole crack detection line disposed adjacent to the hole area to surround the hole area and having a first end and a second end that is separated from the first end; a first detection line extending from the peripheral area and connected to the hole crack detection line to constitute a first closed circuit; a second detection line extending from the peripheral area and connected to the hole crack detection line to constitute a second closed circuit; and a circuit portion connected to the first detection line and the second detection line.

The first detection line may include a first detection transfer line having a first end that is connected to the circuit portion and a second end that is connected to the first end of the hole crack detection line; and a first detection receiving line having a first end that is connected to the circuit portion and the second end that is connected to a second end of the hole crack detection line, wherein the second detection line may include a second detection transfer line having a first end that is connected to the circuit portion and a second end that is connected to the first end of the hole crack detection line, and a second detection receiving line having a first end that is connected to the circuit portion and a second end that is connected to the second end of the hole crack detection line.

The first closed circuit may include the first detection transfer line, the hole crack detection line, and the first detection receiving line, and the second closed circuit may include the second detection transfer line, the hole crack detection line, and the second detection receiving line.

The circuit portion may determine a hole crack defect where a crack occurs in the hole crack detection line when both the first closed circuit and the second closed circuit are determined to be defective.

The first detection line may include a first detection transfer line having a first end that is connected to the circuit portion and a second end that is connected to the first end of the hole crack detection line; and a first detection receiving line having a first end that is connected to the circuit portion and a second end that is connected to the second end of the hole crack detection line, wherein the second detection line may include a second detection transfer line having a first end that is connected to the circuit portion and a second end that is connected to the second end of the hole crack detection line, and a second detection receiving line having a first end that is connected to the circuit portion and a second end that is connected to the first end of the hole crack detection line.

The display device may further include a third detection line extending in parallel with the first detection line in the peripheral area and having opposite ends that are connected to the circuit portion to constitute a third closed circuit; and a fourth detection line extending in parallel with the second detection line in the peripheral area and having opposite ends that are connected to the circuit portion to constitute a fourth closed circuit.

The first detection line may include a first detection transfer line having a first end that is connected to the circuit portion and a second end that is connected to the second end of the hole crack detection line; and a first detection receiving line having a first end that is connected to the circuit portion and a second end that is connected to the second end of the hole crack detection line, wherein the second detection line may include a second detection transfer line having a first end that is connected to the circuit portion and a second end that is connected to the first end of the hole crack detection line, and a second detection receiving line having a first end that is connected to the circuit portion and a second end that is connected to the first end of the hole crack detection line.

The first closed circuit may include the first detection transfer line and the first detection receiving line, and the second closed circuit may include the second detection transfer line and the second detection receiving line.

The first detection transfer line, the hole crack detection line, and the second detection receiving line may constitute a third closed circuit.

The circuit portion may determine a hole crack defect where a crack occurs in the hole crack detection line when the third closed circuit is determined to be defective.

An exemplary embodiment of the present inventive concept provides a display device including: a substrate including a display area where an image is displayed and a peripheral area disposed outside the display area; a hole area disposed within the display area; a first detection line constituting a first closed circuit that extends along a first edge of the display area in the peripheral area and extending to surround a first edge of the hole area, the first detection line including at least first two lines extending substantially parallel to each other and ends of the at least first two lines being connected to each other in a first region adjacent to the hole area; a second detection line constituting a second closed circuit that extends along a second edge of the display area in the peripheral area and extending to surround a second edge of the hole area opposing the first edge of the hole area, the second detection line including at least second two lines extending substantially parallel to each other and ends of the at least second two lines being connected to each other in a second region adjacent to the hole are; and a circuit portion connected to opposite ends of the first detection line and opposite ends of the second detection line.

The hole area may be a region where a hole is formed by removing a substrate and an element disposed on the substrate.

The first detection line and the second detection line may be physically separated and face each other with the hole area interposed therebetween.

The circuit portion may inspect a crack defect at the first edge of the hole area by outputting a first detection signal to the first detection line and receiving a first closed circuit signal that is fed back, and may inspect a crack defect at the second edge of the hole area by outputting a second detection signal to the second detection line and receiving a second closed circuit signal that is fed back.

An exemplary embodiment of the present inventive concept provides an inspecting method of a display device, including: outputting a first detection signal to a first detection line connected to a hole crack detection line and constituting a first closed circuit, the hole crack detection line being disposed adjacent to a hole area disposed in a display area to surround the hole area; outputting a second detection signal to a second detection line connected to the hole crack detection line and constituting a second closed circuit; and determining a hole crack defect in which a crack occurs in the hole crack detection line based on a first closed circuit signal received through the first closed circuit and a second closed circuit signal received through the second closed circuit.

The first closed circuit may include the hole crack detection line, and the second closed circuit may include the hole crack detection line.

The hole crack defect may be determined when the first closed circuit is determined to be defective by the first closed circuit signal and the second closed circuit is determined to be defective by the second closed circuit signal.

The first closed circuit may include a first detection transfer line and a first detection receiving line that are connected to a second end of the hole crack detection line, and the second closed circuit may include a second detection transfer line and a second detection receiving line that are connected to a first end of the hole crack detection line.

The inspecting method may further include outputting the first detection signal to the first detection transfer line and receiving a third closed circuit signal through a third closed circuit formed by the first detection transfer line, the hole crack detection line, and the second detection receiving line.

The hole crack defect may be determined when the first closed circuit and the second closed circuit are determined to be normal and the third closed circuit is determined to be defective.

According to the exemplary embodiments, it is possible to test a crack in the hole area in the display panel having a hole formed thereon.

DETAILED DESCRIPTION

Figure 1:
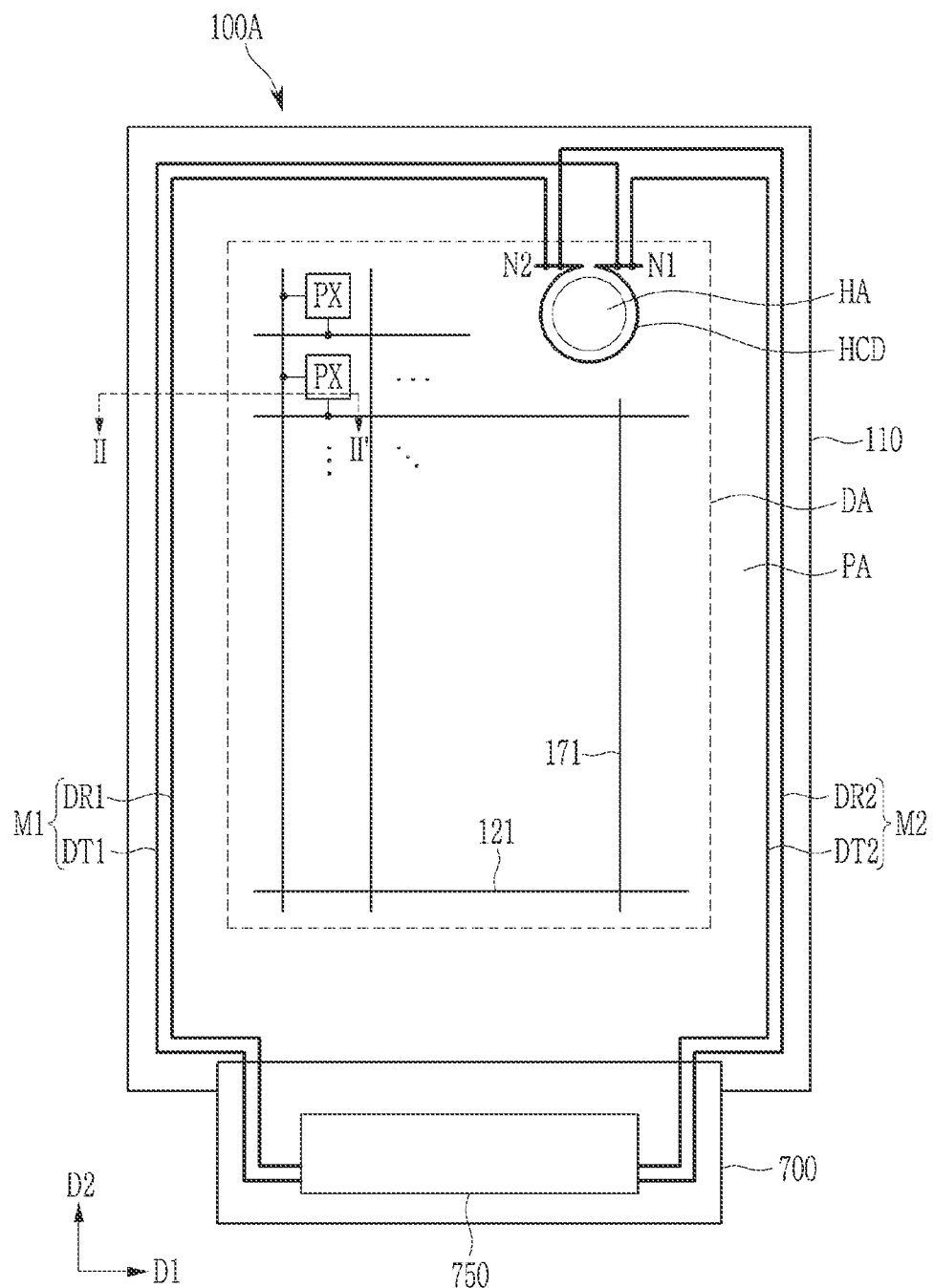
FIG. 1 illustrates a top plan view showing a display device according to an exemplary embodiment of the present inventive concept.

Embodiments of the present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, and does not necessarily mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Hereinafter, a display device according to an exemplary embodiment will be described with reference to FIG. 1 and FIG. 2, and an inspecting method of a display device according to an exemplary embodiment will be described with reference to FIG. 3.

FIG. 1 illustrates a top plan view showing a display device according to an exemplary embodiment of the present inventive concept.

Referring to FIG. 1, the display device includes a display panel 100A and a circuit portion 750.

The display panel 100A according to the present exemplary embodiment includes a display area DA, a peripheral area PA, and a hole area HA. The display panel 100A may include a substrate 110, and the substrate 110 may include the display area DA and the peripheral area PA.

The display area DA is an area in which an image is displayed. The display area DA includes a plurality of pixels PX, and a plurality of signal lines arranged on a plane parallel to a first direction D1 and a second direction D2. A structure observed when viewed in a direction perpendicular to the first direction D1 and the second direction D2 is referred to as a planar structure, and a structure observed when it is cut in the direction perpendicular to the first direction D1 and the second direction D2 is called a cross-sectional structure. The first direction D1 may be perpendicular to the second direction D2. According to an exemplary embodiment, a portion of the display area DA may be arranged on a plane that is in parallel to the first direction D1 and the second direction D2. Another portion of the display area DA may be disposed on a surface or a curved surface that is bent at a predetermined angle with the plane.

The signal lines include a plurality of gate lines 121 for transferring gate signals and a plurality of data lines 171 for transferring data signals. The plurality of gate lines 121 may extend mainly in the first direction D1 to be parallel to each other. The data lines 171 may extend mainly in the second direction D2 to be parallel to each other. The gate lines 121 and the data lines 171 may cross each other in the display area DA.

Each of the pixels PX may include at least one switching element (see TRa in FIG. 2) and a pixel electrode (see 191 in FIG. 2) connected thereto. The switching element may be connected to at least one gate line 121 and at least one data line 171, and is a three-terminal element such as a transistor integrated in the display panel 100A. The switching element may be turned on or off depending on a gate signal transferred by the gate line 121 to selectively transfer the data signal to the pixel electrode.

Each of the pixels PX may emit light of one of primary colors or white light. Examples of the primary colors may include three primary colors of red, green and blue. Other examples of the primary colors include yellow, cyan, and magenta.

The substrate 110 may include glass, plastic, etc., and may have flexibility. For example, the substrate 110 may include various plastics such as polyethylene terephthalate (PET), polyethylene naphthalate (PEN), polycarbonate (PC), polyarylate (PAR), polyetherimide (PEI), polyethersulfone, polyimide (PI), or the like, a metal thin film, glass, or the like.

The hole area HA is disposed in the display area DA. The hole area HA may be a region where a hole is formed by removing the substrate 110 and an element disposed on the substrate 110. The hole may be formed by punching the substrate 110 and the element stacked on the substrate 110. That is, the hole may be formed by punching the display panel 100A. The hole area HA may be an area for arranging devices such as a camera, a flash, a speaker, an optical sensor, and the like in the display area DA.

The display area DA includes a hole crack detection line HCD arranged adjacent to the hole area HA. The hole crack detection line HCD may be disposed adjacent to the hole area HA to surround a periphery of the hole area HA. A first end and a second end of the hole crack detection line HCD may be separated each other. For example, the hole crack detection line HCD may surround the periphery of the hole area HA in a shape of an upper-case omega (Ω). The hole crack detection line HCD is a wire for detecting a crack in the vicinity of the hole area HA.

The peripheral area PA may surround the display area DA to be disposed outside of the display area DA. The peripheral area PA may include a first detection line M1 and a second detection line M2. The peripheral area PA may include a gate driver (not illustrated) connected to the gate lines 121 to output a gate signal.

The first detection line M1 includes a first detection transfer line DT1 and a first detection receiving line DR1. The first detection transfer line DT1 includes a first end connected to the circuit portion 750 and a second end connected to the first end N1 of the hole crack detection line HCD. The first detection receiving line DR1 includes a first end connected to the circuit portion 750 and a second end connected to the second end N2 of the hole crack detection line HCD. The first detection transfer line DT1, the hole crack detection line HCD, and the first detection receiving line DR1 may constitute a first closed circuit.

The first detection transfer line DT1 and the first detection receiving line DR1 are disposed in the peripheral area PA at lower, left and upper sides of the display area DA, and may be connected to the hole crack detection line HCD at the upper side thereof. The first detection transfer line DT1 and the first detection receiving DR1 may extend toward the circuit portion 750 to be connected to the circuit portion 750 in the peripheral area PA disposed at the lower side of the display panel 110A. That is, each of the first detection transfer line DT1 and the first detection receiving line DR1 may include a portion that extends from the circuit portion 750 to the peripheral area PA at the lower side of the display panel 110A, a portion that extends along a lower edge of the display area DA, a portion that extends along a left edge of the display area DA, and a portion that extends along an upper edge of the display area DA. The first detection transfer line DT1 and the first detection receiving line DR1 may extend in parallel along an edge of the display area DA.

The second detection line M2 includes a second detection transfer line DT2 and a second detection receiving line DR2. The second detection transfer line DT2 includes a first end connected to the circuit portion 750 and a second end connected to the first end N1 of the hole crack detection line HCD. The second detection receiving line DR2 includes a first end connected to the circuit portion 750 and a second end connected to the second end N2 of the hole crack detection line HCD. The second detection transfer line DT2, the hole crack detection line HCD and the second detection receiving line DR2 may constitute a second closed circuit.

The second detection transfer line DT2 and the second detection receiving line DR2 are disposed in the peripheral area PA at lower, right and upper sides of the display area DA, and may be connected to the hole crack detection line HCD at the upper side thereof. The second detection transfer line DT2 and the second detection receiving line DR2 may extend toward the circuit portion 750 to be connected to the circuit portion 750 in the peripheral area PA disposed at the lower side of the display panel 110A. That is, each of the second detection transfer line DT2 and the second detection receiving line DR1 may include a portion that extends from the circuit portion 750 to the peripheral area PA at the lower side of the display panel 110A, a portion that extends along a lower edge of the display area DA, a portion that extends along a right edge of the display area DA, and a portion that extends along an upper edge of the display area DA. The second detection transfer line DT2 and the second detection receiving line DR2 may extend in parallel along an edge of the display area DA.

The circuit portion 750 may be disposed on a printed circuit film 700 that is connected to the peripheral area PA of the display panel 100A as illustrated therein. Alternatively, the circuit portion 750 may be directly mounted on the peripheral area PA of the display panel 100A, or may be formed directly on the substrate 110 together with constituent elements such as transistors of the pixel PX. The print circuit film 700 may further include a data driver for generating a data signal for driving the pixel PX, and a timing controller. The circuit portion 750 may be formed as an IC chip. Hereinafter, a case where the circuit portion 750 is disposed in the printed circuit film 700 will be described as an example. A case where the circuit portion 750 is disposed in the peripheral area PA will be described with reference to FIG. 12 to FIG. 18.

The circuit portion 750 may include a plurality of pad portions that are electrically bonded to each first end of the first detection transfer line DT1, the first detection receiving line DR1, the second detection transfer line DT2 and the second detection receiving line DR2, or that are electrically bonded to pads connected to each first end of the first detection transfer line DT1, the first detection receiving line DR1, the second detection transfer line DT2 and the second detection receiving line DR2. Such pads may be disposed at portions where the circuit portion 750 meets the first detection transfer line DT1, the first detection receiving line DR1, the second detection transfer line DT2 and the second detection receiving line DR2.

When the circuit portion 750 is disposed on the printed circuit film 700, the first detection transfer line DT1, the first detection receiving line DR1, the second detection transfer line DT2 and the second detection receiving line DR2 may extend to the printed circuit film 700. In this case, the first detection transfer line DT1, the first detection receiving line DR1, the second detection transfer line DT2 and the second detection receiving line DR2 include wires disposed in the display panel 100A and wires disposed in the printed circuit film 700 to be connected to the circuit portion 750.

The circuit portion 750 may check whether a first closed circuit is normal by applying a first detection signal to the first detection transfer line DT1 and receiving a first closed circuit signal through the first detection receiving line DR1. The circuit portion 750 may check whether a second closed circuit is normal by applying a second detection signal to the second detection transfer line DT2 and receiving a second closed circuit signal through the second detection receiving line DR2. In addition, the circuit portion 750 may detect a crack around the hole area HA depending on whether the first closed circuit is normal or not and whether the second closed circuit is normal or not. An inspecting method of such a display device will be described later with reference to FIG. 3.

Hereinafter, a cross-sectional structure of the display device will be described with reference to FIG. 2 as well as FIG. 1.

Figure 2:
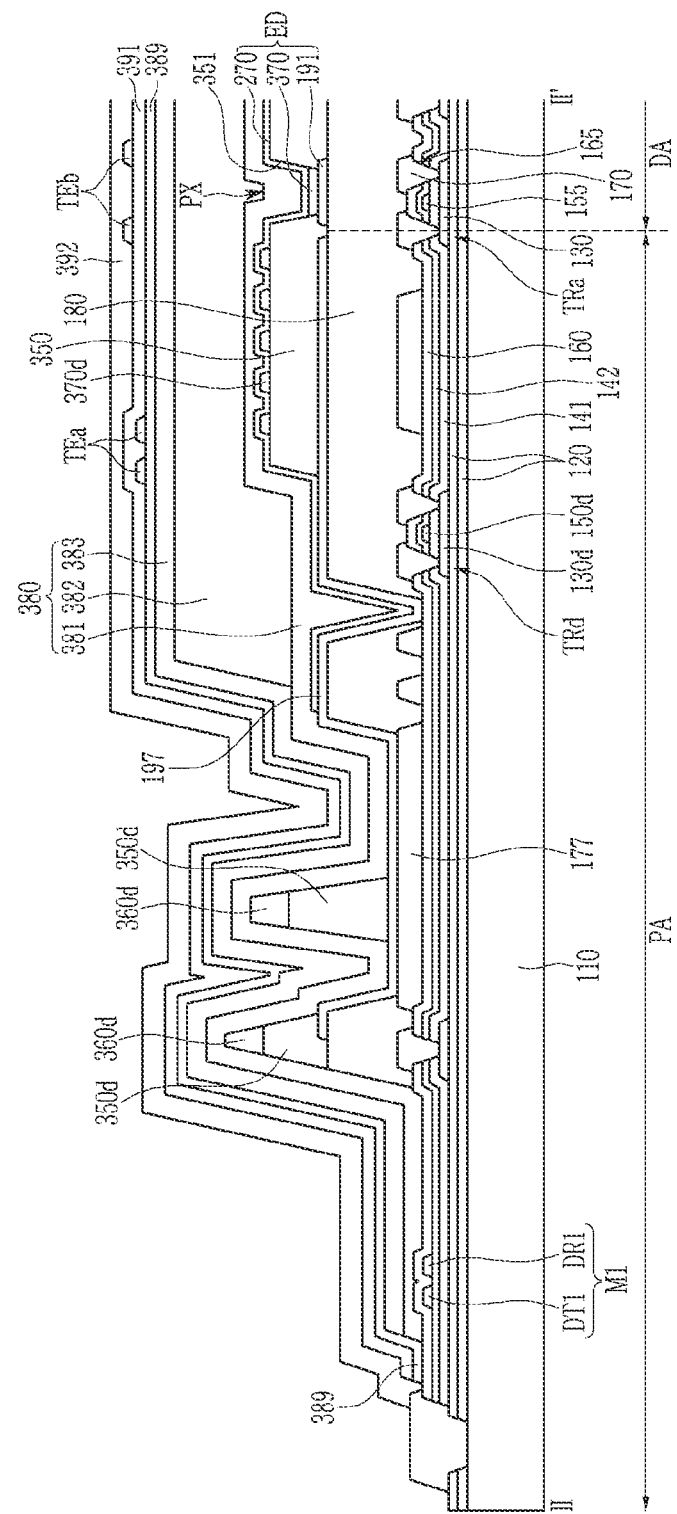
FIG. 2 illustrates a cross-sectional view of the display device taken along a line II-II' of FIG. 1.

FIG. 2 illustrates a cross-sectional view of the display device taken along a line II-II' of FIG. 1.

Referring to FIG. 2, a barrier layer 120 may be disposed on the substrate 110. The barrier layer 120 may include a plurality of layers as illustrated therein. Alternatively, the barrier layer 120 may be formed as a single layer.

Active patterns 130 and 130*d* are disposed on the barrier layer 120. The active patterns 130 and 130*d* may include an active pattern 130 disposed in the display area DA and an active pattern 130*d* disposed in the peripheral area PA. Each of the active patterns 130 and 130*d* may include a source region and a drain region, and a channel region disposed therebetween. The active patterns 130 and 130d may include amorphous silicon, polycrystalline silicon, an oxide semiconductor, or the like.

A first insulating layer 141 may be disposed on the active patterns 130 and 130d, and a first conductive layer may be disposed on the first insulating layer 141. The first conductive layer includes a conductor 155 that overlaps the active pattern 130 disposed in the display area DA, a conductor 150d that overlaps the active pattern 130d disposed in the peripheral area PA, and the gate lines 121 and the like described above.

The active pattern 130 of the display area DA and the conductor 155 which overlaps with the active pattern 130 may constitute a transistor TRa which functions as a switching element included in each pixel PX. The active pattern 130d of the peripheral area PA and the conductor 150d which overlaps with the active pattern 130d may constitute a transistor TRd which functions as a switching element included in the gate driver.

A second insulating layer 142 may be disposed on the first conductive layer and the first insulating layer 141, and a second conductive layer may be disposed on the second insulating layer 142. The second conductive layer may include a first detection line M1, a second detection line M2, and a hole crack detection line HCD. According to an embodiment, at least one of the first detection line M1, the second detection line M2, and the hole crack detection line HCD may be disposed in a conductive layer other than the second conductive layer. For example, the hole crack detection line HCD may be disposed in a fourth conductive layer or a fifth conductive layer to be described later.

A third insulating layer 160 may be disposed on the second conductive layer and the second insulating layer 142.

At least one of the first insulating layer 141, the second insulating layer 142, and the third insulating layer 160 may include an inorganic insulating material such as a silicon nitride ($SiN_x$), a silicon oxide ($SiO_x$), or a silicon oxynitride (SiON), and/or an organic insulating material.

The first insulating layer 141, the second insulating layer 142, and the third insulating layer 160 may include contact holes 165 exposing the source region and/or the drain region of the transistors TRa and TRd.

A third conductive layer may be disposed on the third insulating layer 160. The third conductive layer may include a conductor 170 connected to the source region or the drain region of the transistors TRa and TRd through the contact holes 165, a voltage transfer line 177 and the data line 171 as described above. The voltage transfer line 177 may be disposed in the peripheral area PA to transfer a common voltage.

At least one of the first conductive layer, the second conductive layer, and the third conductive layer is made of a conductive material such as copper (Cu), aluminum (Al), molybdenum (Mo), titanium (Ti), tantalum (Ta), and an alloy of at least two metals thereof.

A passivation layer 180 is formed on the third conductive layer and the third insulating layer 160. The passivation layer 180 may include an inorganic insulating material and/or an organic insulating material. The organic insulating material may include a polyacrylic resin, a polyimide-based resin, and the like. A top surface of the passivation layer 180 may be planarized. The passivation layer 180 may have a contact hole exposing the voltage transfer line 177 disposed in the peripheral area PA.

A pixel electrode layer is disposed on the passivation layer 180. The pixel electrode layer may include a pixel electrode 191 corresponding to each pixel PX in the display area DA, and a voltage transfer electrode 197 disposed in the peripheral area PA. The voltage transfer electrode 197 is physically and electrically connected to the voltage transfer line 177 through a contact hole in the passivation layer 180 to receive a common voltage. The pixel electrode layer may include a transflective conductive material or a reflective conductive material.

A pixel definition layer 350 is disposed on the passivation layer 180 and the pixel electrode layer. The pixel definition layer 350 may have an opening 351 disposed on the pixel electrode 191, and at least one dam portion 350d disposed in the peripheral area PA. The dam portion 350d may extend along an edge of the substrate 110 in a plan view. A spacer 360d may be further disposed on the dam portion 350d. The pixel definition layer 350 may include a photosensitive material such as a polyacrylic resin or a polyimide-based resin.

As illustrated in FIG. 2, the first detection line M1 may be disposed at an opposite side (outside) of the display area DA with respect to the dam portion 350d. Similarly, the second detection line M2 may be disposed at the opposite side of the display area DA with respect to the dam portion 350d. According to an exemplary embodiment, the first detection line M1 and the second detection line M2 may be disposed at the same side of the display area DA with respect to the dam portion 350d, for example, inside of the dam portion 350d.

The voltage transfer electrode 197 includes a portion that is not covered by the pixel definition layer 350.

An emission layer 370 is disposed on the pixel electrode 191. The emission layer 370 may include a portion disposed within the opening 351 of the pixel definition layer 350. The emission layer 370 may further include at least one dummy emission layer 370d disposed in the peripheral area PA and disposed on the pixel definition layer 350. The emission layer 370 may include an organic emission material or an inorganic emission material.

A common electrode 270 may be disposed on the emission layer 370. The common electrode 270 may also be formed on the pixel definition layer 350 and continuously formed over the pixels PX. The common electrode 270 is physically and electrically connected to the voltage transfer electrode 197 in the peripheral area PA to receive a common voltage. The common electrode 270 may include a transparent conductive material.

The pixel electrode 191, the emission layer 370, and the common electrode 270 of each pixel PX constitute a light emitting diode ED, and one of the pixel electrode 191 and the common electrode 270 serves as an anode and the other serves as a cathode.

An encapsulation portion 380 for protecting and encapsulating the light emitting diode ED may be disposed on the common electrode 270. The encapsulation portion 380 may include at least one of inorganic layers 381 and 383 and at least one organic layer 382. At least one of the inorganic layers 381 and 383 and at least one organic layer 382 may be alternately stacked. The organic layer 382 may include an organic material and may have a planarizing property. The inorganic layers 381 and 383 may be made of an inorganic material such as an aluminum oxide ($AlO_x$), a silicon oxide ($SiO_x$), a silicon nitride ($SiN_x$), and a silicon oxynitride (SiON).

A planar area of the inorganic layers 381 and 383 is wider than that of the organic layer 382, allowing the two inorganic layers 381 and 383 to contact each other in the peripheral area PA. The inorganic layer 381 disposed at a lowest position of the inorganic layers 381 and 383 may contact an upper surface of the third insulating layer 160 in the peripheral area PA, but the present inventive concept is not limited thereto.

An edge of the organic layer 382 included in the encapsulation portion 380 may be disposed between the dam portion 350d and the display area DA. The dam portion 350d may function to prevent the organic material from flowing out when the organic layer 382 of the encapsulation portion 380 is formed.

A buffer layer 389 including an inorganic insulating material and/or an organic insulating material may be disposed on the encapsulation portion 380. The buffer layer 389 may be omitted.

A fourth conductive layer may be disposed on the buffer layer 389. The fourth conductive layer may include a first touch conductor TEa. A first touch insulation layer 391 may be disposed on the fourth conductive layer, and a fifth conductive layer may be disposed on the first touch insulation layer 391. The fifth conductive layer may include a second touch conductor TEb. A second touch insulating layer 392 may be disposed on the fifth conductive layer. The first touch conductor TEa and the second touch conductor TEb constitute a capacitive touch sensor, and may detect touch information such as touch existence or touch position when an external object is touched.

Hereinafter, an inspecting method of the display device will be described with reference to FIG. 3 as well as FIG. 1.

Figure 3:
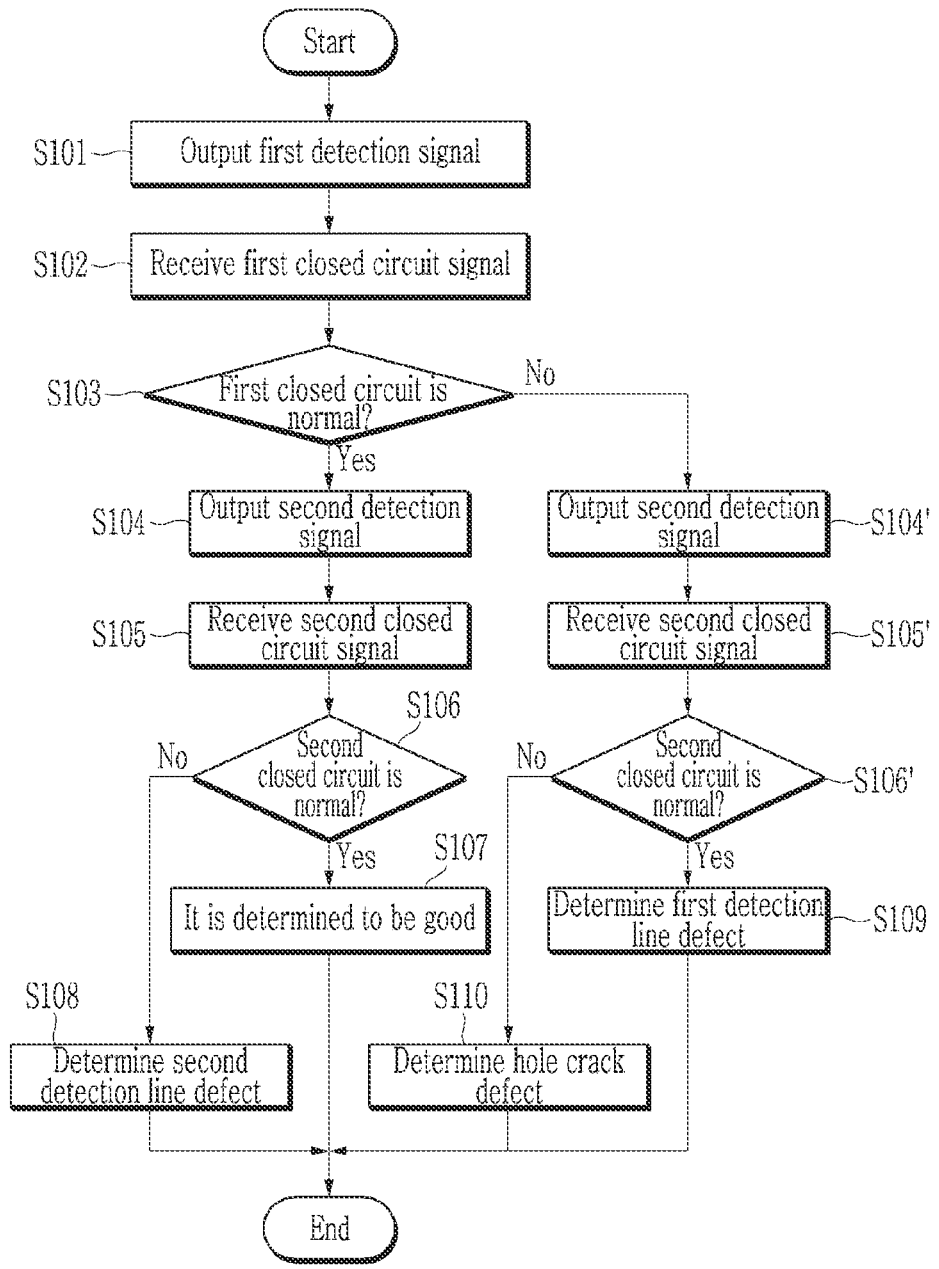
FIG. 3 illustrates a flowchart showing an inspecting method of a display device according to an exemplary embodiment of the present inventive concept.

FIG. 3 illustrates a flowchart showing an inspecting method of a display device according to an exemplary embodiment of the present inventive concept.

Referring to FIG. 3, the circuit portion 750 outputs the first detection signal to the first detection transfer line DT1 (S101). The first detection signal is transferred to a first end N1 of the hole crack detection line HCD through the first detection transfer line DT1 and to the first detection receiving line DR1 through the hole crack detection line HCD.

The circuit portion 750 receives the first detection signal transferred through the first detection receiving line DR1 as a first closed circuit signal (S102). That is, the circuit portion 750 receives the first closed circuit signal transferred through the first closed circuit formed by the first detection transfer line DT1, the hole crack detection line HCD, and the first detection receiving line DR1. The first closed circuit signal may be received as a voltage that is lower than the first detection signal by a level corresponding to the resistance of the first detection transfer line DT1, the hole crack detection line HCD, and the first detection receiving line DR1.

The circuit portion 750 determines whether the first closed circuit is normal or not (S103). The circuit portion 750 may determine that the first closed circuit is normal when a voltage of the first closed circuit signal is included in a predetermined reference voltage range. The reference voltage range may be predetermined by reflecting a result of measuring the voltage of the first closed circuit signal in a state where no crack occurs in the display panel 100A and stored in the circuit portion 750. Alternatively, the circuit portion 750 may determine that the first closed circuit is normal based on the first closed circuit signal when the resistance of the first detection transfer line DT1, the hole crack detection line HCD, and the first detection receiving line DR1 is included in a reference resistance range. The reference resistance range may be predetermined by reflecting a result of measuring the resistance of the first detection transfer line DT1, the hole crack detection line HCD, and the first detection receiving line DR1 in a state where no crack occurs in the display panel 100A and stored in the circuit portion 750.

When the first closed circuit is normal, the circuit portion 750 outputs a second detection signal to the second detection transfer line DT2 (S104). The second detection signal is transferred to the first end N1 of the hole crack detection line HCD through the second detection transfer line DT2 and to the second detection receiving line DR2 through the hole crack detection line HCD.

The circuit portion 750 receives the second detection signal transferred through the second detection receiving line DR2 as a second closed circuit signal (S105). That is, the circuit portion 750 receives the second closed circuit signal transferred through the second closed circuit formed by the second detection transfer line DT2, the hole crack detection line HCD, and the second detection receiving line DR2. The second closed circuit signal may be received as a voltage that is lower than the second detection signal by a level corresponding to the resistance of the second detection transfer line DT2, the hole crack detection line HCD, and the second detection receiving line DR2.

The circuit portion 750 determines whether the second closed circuit is normal or not (S106). The circuit portion 750 may determine that the second closed circuit is normal when a voltage of the second closed circuit signal is included in a predetermined reference voltage range. Alternatively, the circuit portion 750 may determine that the second closed circuit is normal based on the second closed circuit signal when the resistance of the second detection transfer line DT2, the hole crack detection line HCD, and the second detection receiving line DR2 is included in a reference resistance range.

When the second closed circuit is normal, the circuit portion 750 determines that the display panel 100A is good (S107). That is, the circuit portion 750 may determine that no crack has occurred in the vicinity of the edge and the hole of the display panel 100A.

The circuit portion 750 determines a defect of the second detection line M2 exist when the voltage of the second closed circuit signal is not included in the predetermined reference voltage range or the resistance of the second detection transfer line DT2, the hole crack detection line HCD, and the second detection receiving line DR2 is not included in the reference resistance range. That is, the circuit portion 750 may determine that a crack has occurred at a right edge or an upper edge of the display panel 100A. The circuit portion 750 may generate and output a signal corresponding to a crack defect of the second detection line M2.

Meantime, even when the first closed circuit is not normal (is defective), the circuit portion 750 outputs a second detection signal to the second detection transfer line DT2 (S104'). The circuit portion 750 receives the second detection signal transferred through the second detection receiving line DR2 as a second closed circuit signal (S105'), and determines whether the second closed circuit is normal (S106').

When the second closed circuit is normal, the circuit portion 750 determines a defect of the first detection line M1 (S109). That is, the circuit portion 750 may determine that a crack has occurred at a left edge or an upper edge of the display panel 100A. The circuit portion 750 may generate and output a signal corresponding to a crack defect of the first detection line M1.

When the second closed circuit is not normal (is defective), the circuit portion 750 determines that a hole crack defect exists (S110). That is, when both of the first closed circuit and the second closed circuit are defective, the circuit portion 750 may determine that a hole crack defect exists in the hole crack detection line HCD. A crack may occur in both the first detection line M1 and the second detection line M2, but it is extremely rare for a crack to occur in both the first detection line M1 and the second detection line M2 in the manufacturing process of the display panel 100A. Accordingly, the circuit portion 750 may determine a hole crack defect exist when it is determined (measured) that both the first closed circuit and the second closed circuit are defective. The circuit portion 750 may generate and output a signal corresponding to the hole crack defect.

Hereinafter, a display device according to an exemplary embodiment of the present inventive concept will be described with reference to FIG. 4. Differences from the aforementioned exemplary embodiment of FIG. 1 to FIG. 3 will be mainly described.

Figure 4:
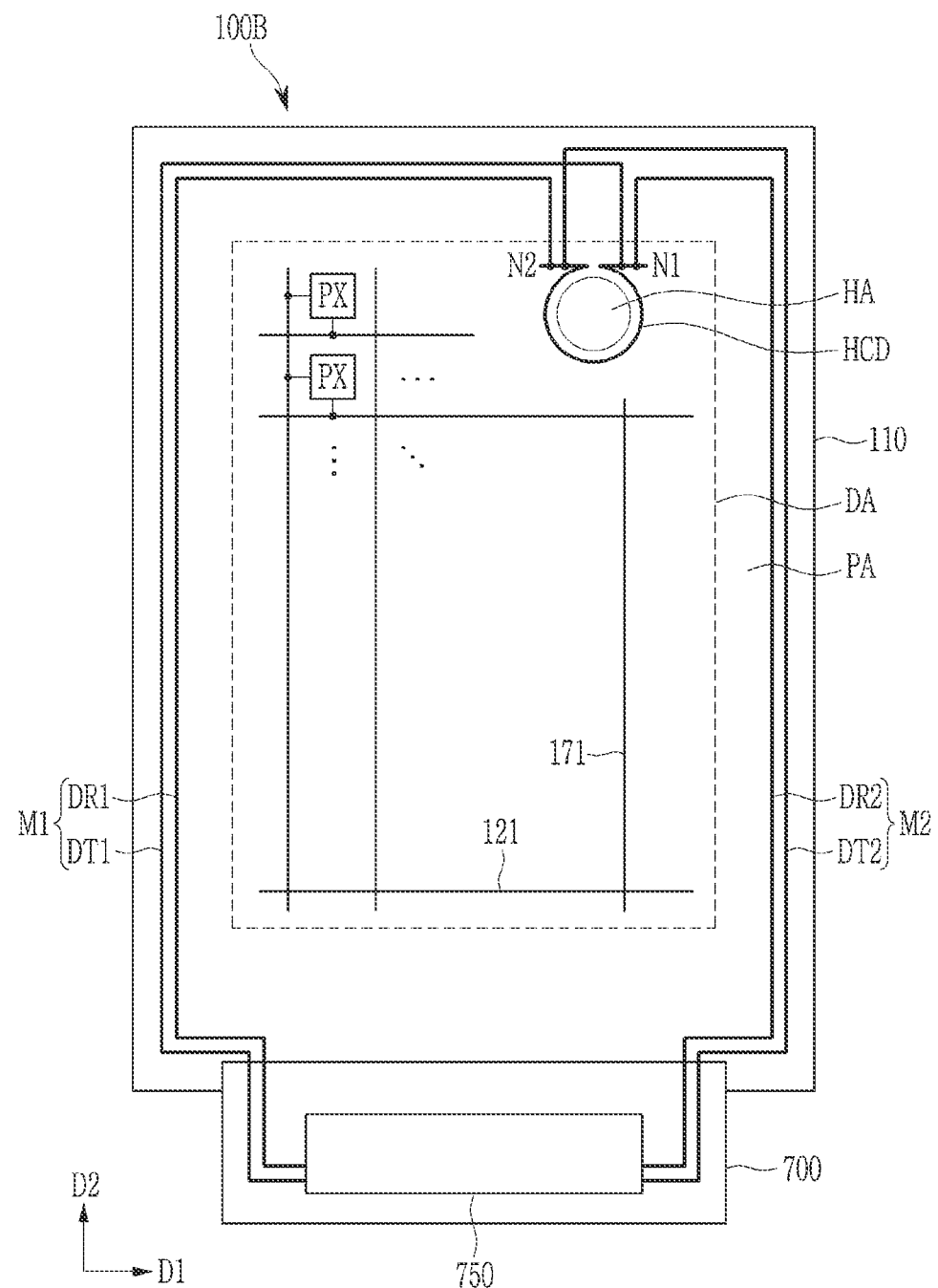
FIG. 4 illustrates a top plan view of a display device according to an exemplary embodiment of the present inventive concept.

FIG. 4 illustrates a top plan view of a display device according to an exemplary embodiment of the present inventive concept.

Referring to FIG. 4, according to the present exemplary embodiment, a display panel 100B included in the display device may include a first detection line M1 and a second detection line M2, and the first detection transfer line DT1 included in the first detection line M1 and the second detection transfer line DT2 included in the second detection line M2 may be connected to different ends of the hole crack detection line HCD. The first detection receiving line DR1 included in the first detection line M1 and the second detection receiving line DR2 included in the second detection line M2 may be connected to different ends of the hole crack detection line HCD.

For example, as illustrated in FIG. 4, when the first detection transfer line DT1 is connected to the first end N1 of the hole crack detection line HCD and the first detection receiving line DR1 is connected to a second end N2 of the hole crack detection line HCD, the second detection transfer line DT2 may be connected to the second end N2 of the hole crack detection line HCD, and the second detection receiving line DR2 may be connected to the first end N1 of the hole crack detection line HCD Except for these differences, the features of the exemplary embodiments described above with reference to FIG. 1 to FIG. 3 may be applied to all of the exemplary embodiments described with reference to FIG. 4, so redundant description is omitted among the exemplary embodiments.

Hereinafter, a display device according to an exemplary embodiment of the present inventive concept will be described with reference to FIG. 5 and FIG. 6. Differences from the aforementioned exemplary embodiment of FIG. 1 to FIG. 3 will be mainly described.

Figure 5:
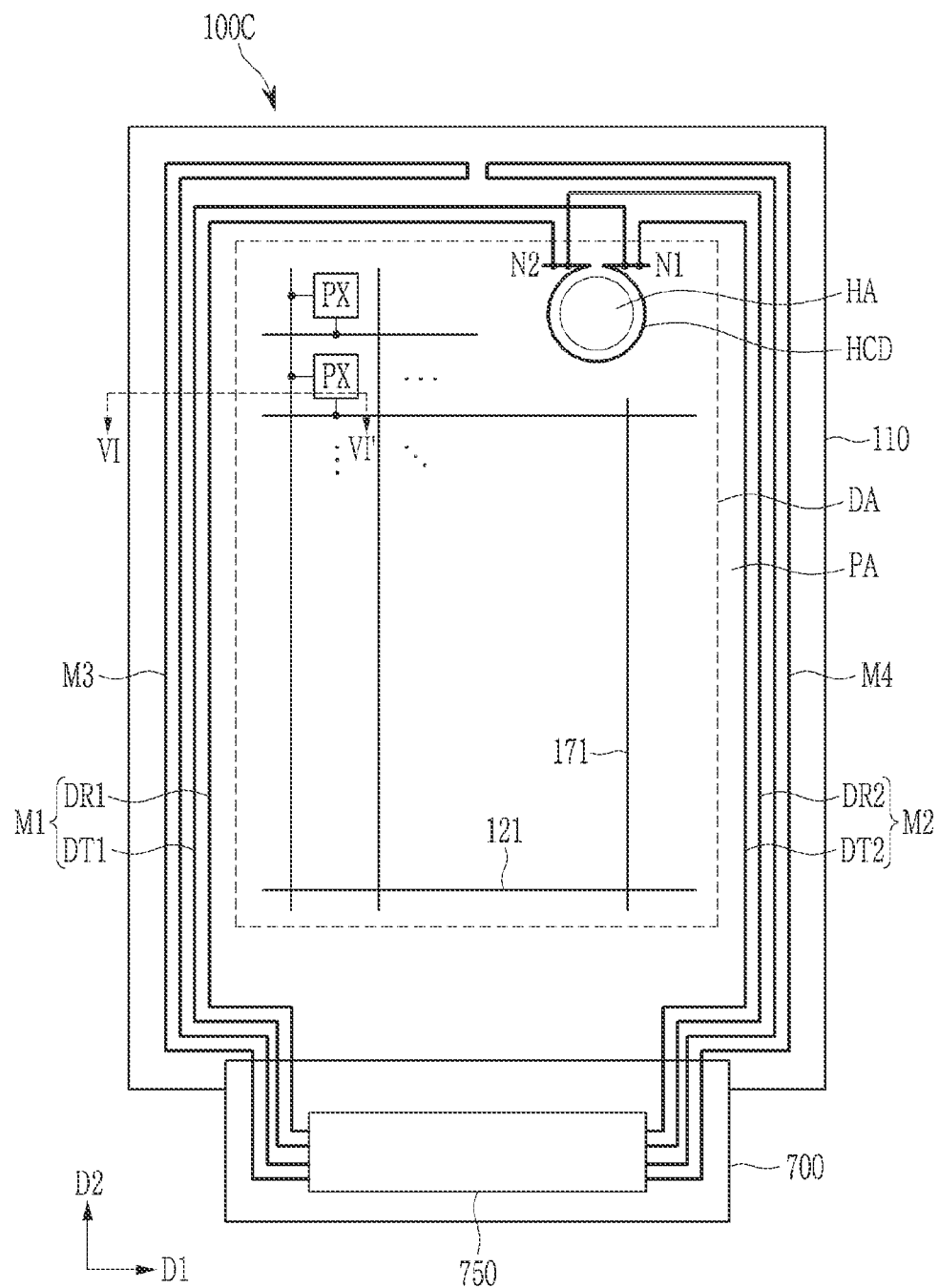
FIG. 5 illustrates a top plan view of a display device according to an exemplary embodiment of the present inventive concept.

FIG. 5 illustrates a top plan view of a display device according to an exemplary embodiment of the present inventive concept. FIG. 6 illustrates a cross-sectional view of the display device taken along a line VI-VI' of FIG. 5.

Figure 6:
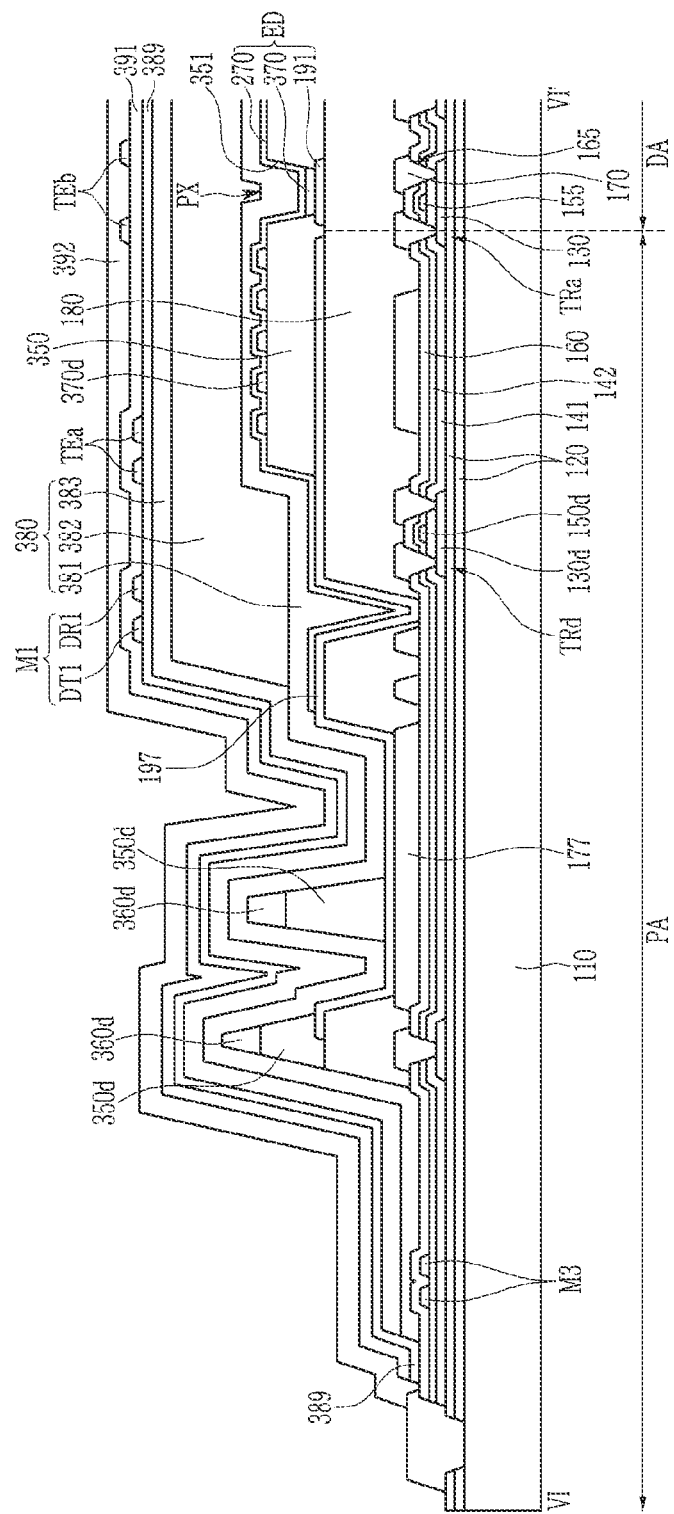
FIG. 6 illustrates a cross-sectional view of the display device taken along a line VI-VI' of FIG. 5.

Referring to FIG. 5 and FIG. 6, in the display panel 100C according to the present exemplary embodiment, the peripheral area PA may further include a third detection line M3 and a fourth detection line M4 which are not connected to the hole crack detection line HCD.

Opposite ends of the third detection line M3 may be connected to the circuit portion 750 to constitute a third closed circuit. The third detection line M3 may be disposed in the peripheral area PA at lower, left, and upper sides of the display area DA. That is, the third detection line M3 may have two substantially parallel lines each ends of which is connected to each other at the upper side of the display area DA in the peripheral area PA and be disposed in the peripheral area PA to have a closed circuit shape that extends from the circuit portion 750 toward the display area DA. For example, the third detection line M3 may include a first portion extending along the lower edge of the display area DA in a direction that is opposite to the first direction D1, a second portion extending along a left edge of the display area DA in the second direction D2, and a third portion extending along the upper edge of the display area DA in the first direction D1.

Opposite ends of the fourth detection line M4 may be connected to the circuit portion 750 to constitute a fourth closed circuit. The fourth detection line M4 may be disposed in the peripheral area PA at lower, right, and upper sides of the display area DA. That is, the fourth detection line M4 may have two substantially parallel lines each ends of which is connected to each other at the upper side of the display area DA in the peripheral area PA and be disposed in the peripheral area PA to have a closed circuit shape that extends from the circuit portion 750 toward the display area DA. For example, the fourth detection line M4 may include a first portion extending along the lower edge of the display area DA in the first direction D1, a second portion extending along a right edge of the display area DA in the second direction D2, and a third portion extending along the upper edge of the display area DA in a direction that is opposite to the first direction D1.

The third detection line M3 may be disposed outside of the first detection line M1. That is, the first detection line M1 may be disposed between the third detection line M3 and the display area DA, and the third detection line M3 may be disposed closer to an edge of the substrate 110 than the first detection line M1.

The fourth detection line M4 may be disposed outside the second detection line M2. That is, the second detection line M2 may be disposed between the fourth detection line M4 and the display area DA, and the fourth detection line M4 may be disposed closer to an edge of the substrate 110 than the second detection line M2.

The first detection line M1 and the second detection line M2 may be disposed in different conductive layers from the third detection line M3 and the fourth detection line M4.

As illustrated in FIG. 6, the third detection line M3 may be disposed in the second conductive layer. Similarly, the fourth detection line M4 may also be disposed in the second conductive layer. In this case, the first detection line M1 may be disposed in a fourth conductive layer, and the second detection line M2 may also be disposed in the fourth conductive layer. The first detection line M1 and the second detection line M2 may be disposed inward (between the display area DA and the dam portion 350d) with respect to the dam portion 350d.

Alternatively, the first detection line M1 and the second detection line M2 may be disposed in the same second conductive layer as the third detection line M3 and the fourth detection line M4. In this case, the first detection line M1 and the second detection line M2 may be disposed in parallel with the third detection line M3 and the fourth detection line M4 at the inside or outside of the dam portion 350d.

The circuit portion 750 may output a third detection signal to the third detection line M3 and receive a third detection signal (or a third closed circuit signal) that is fed back to inspect crack defects at the lower edge, the left edge and the upper edge of the display panel 100C. The circuit portion 750 may output a fourth detection signal to the fourth detection line M4 and receive a fourth detection signal (or a fourth closed circuit signal) that is fed back to inspect crack defects at the lower edge, the right edge and the upper edge of the display panel 100C.

Except for these differences, the features of the exemplary embodiments described above with reference to FIG. 1 to FIG. 3 may be applied to the exemplary embodiment described with reference to FIG. 5 and FIG. 6, so redundant description is omitted among the exemplary embodiments.

Hereinafter, a display device according to an exemplary embodiment of the present inventive concept will be described with reference to FIG. 7, and an inspecting method of the display device of FIG. 7 will be described with reference to FIG. 8. Differences from the aforementioned exemplary embodiment of FIG. 1 to FIG. 3 will be mainly described.

Figure 7:
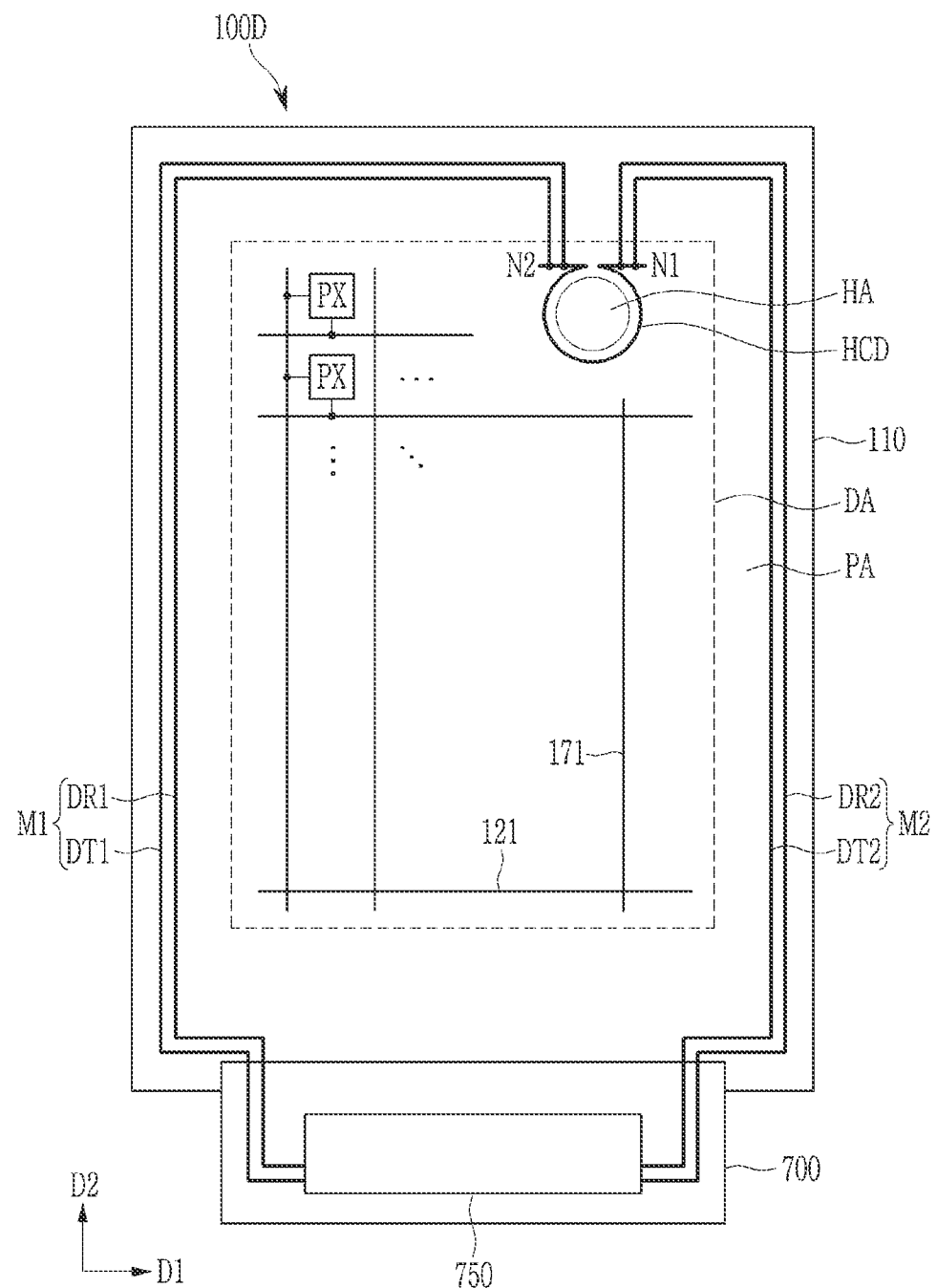
FIG. 7 illustrates a top plan view of a display device according to an exemplary embodiment of the present inventive concept.

FIG. 7 illustrates a top plan view of a display device according to an exemplary embodiment of the present inventive concept. FIG. 8 illustrates a flowchart showing an inspecting method of a display device according to an exemplary embodiment of the present inventive concept.

Referring to FIG. 7, according to the present exemplary embodiment, the display panel 100D may include a first detection line M1 and a second detection line M2, which are connected with different ends of the hole crack detection line HCD, a first detection transfer line DT1 and a first detection receiving line DR1 included in the first detection line M1 may be connected with the same ends of the hole crack detection line HCD, and the second detection transfer line DT2 and the second detection receiving line DR2 included in the second detection line M2 may be connected with the same ends of the hole crack detection line HCD.

For example, as illustrated in FIG. 7, the first detection transfer line DT1 and the first detection receiving line DR1 may be connected with a second end N2 of the hole crack detection line HCD, and the second detection transfer line DT2 and the second detection receiving line DR2 may be connected with a first end N1 of the hole crack detection line HCD. The first detection transfer line DT1 and the first detection receiving line DR1 may be connected to each other at the second end N2 of the hole crack detection line HCD to constitute a first closed circuit. The second detection transfer line DT2 and the second detection receiving line DR2 may be connected to each other at the first end N1 of the hole crack detection line HCD to constitute a second closed circuit. In addition, the first detection transfer line DT1, the hole crack detection line HCD, and the second detection receiving line DR2 may constitute a third closed circuit. The second detection transfer line DT2, the hole crack detection line HCD, and the first detection receiving line DR1 may constitute a fourth closed circuit.

Figure 8:
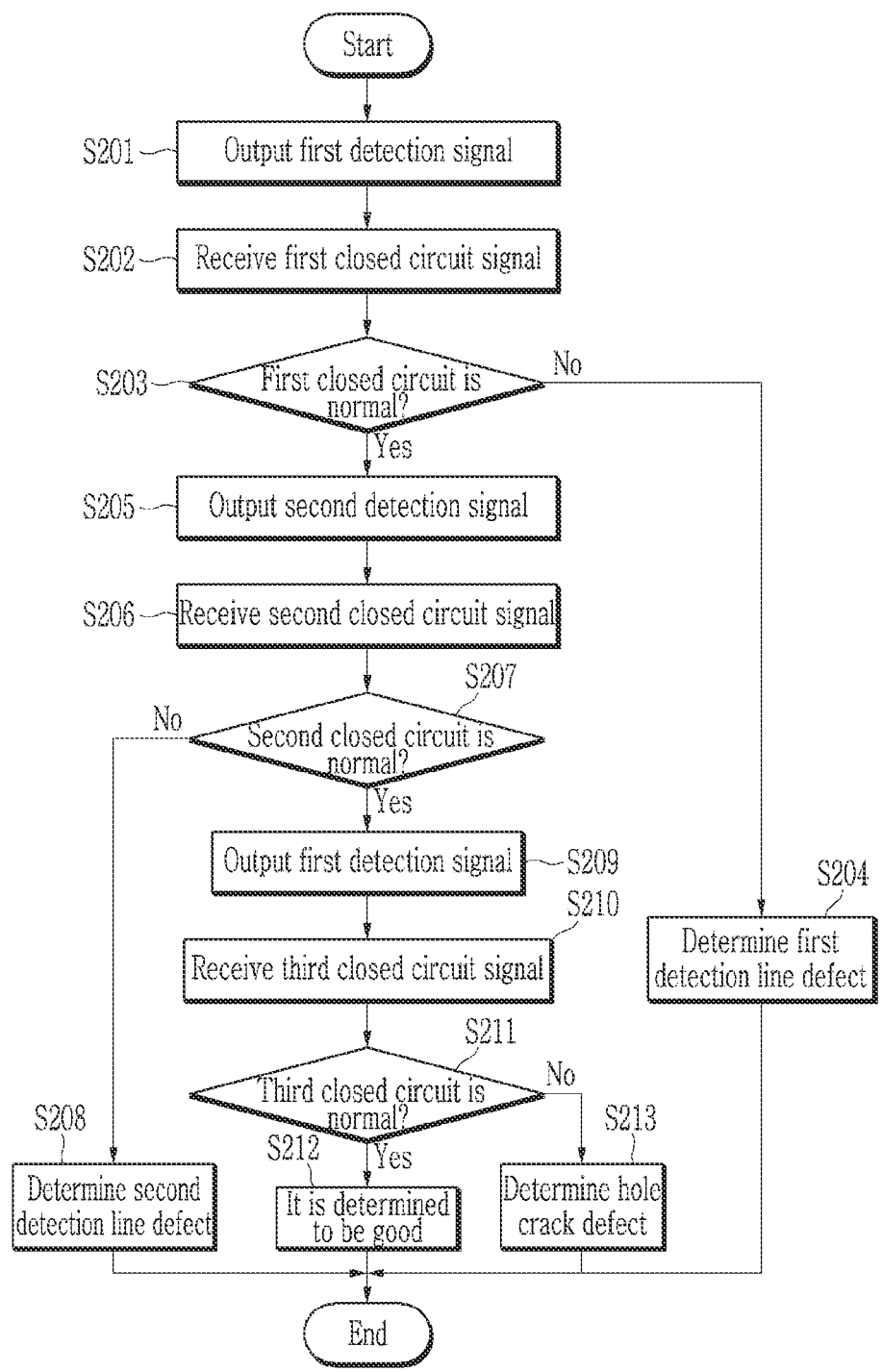
FIG. 8 illustrates a flowchart showing an inspecting method of a display device according to an exemplary embodiment of the present inventive concept.

In this case, the display device may be inspected as illustrated in FIG. 8. Referring to FIG. 8, the circuit portion 750 outputs the first detection signal to the first detection transfer line DT1 (S201). The first detection signal is transferred to the second end N2 of the hole crack detection line HCD through the first detection transfer line DT1 and transferred to the first detection receiving line DR1 at the second end N2.

The circuit portion 750 receives the first detection signal transferred through the first detection receiving line DR1 as a first closed circuit signal (S202). That is, the circuit portion 750 receives the first closed circuit signal transferred through the first detection transfer line DT1, the second end N2 of the hole crack detection line HCD, and the first detection receiving line DR1.

The circuit portion 750 determines whether the first closed circuit is normal or not (S203).

When a voltage of the first closed circuit signal is not included in a predetermined reference voltage range or a resistance of the first closed circuit is not included in a reference resistance range, the circuit portion 750 determines that a defect of the first detection line M1 exists (S204). That is, the circuit portion 750 may determine that a crack has occurred at a lower edge, a left edge or an upper edge of the display panel 100D.

When the first closed circuit is normal, the circuit portion 750 outputs a second detection signal to the second detection transfer line DT2 (S205). The second detection signal is transferred to the first end N1 of the hole crack detection line HCD through the second detection transfer line DT2 and transferred to the second detection receiving line DR2 at the first end N1.

The circuit portion 750 receives the second detection signal transferred through the second detection receiving line DR2 as a second closed circuit signal (S206). That is, the circuit portion 750 receives the second closed circuit signal transferred through the second closed circuit formed by the second detection transfer line DT2, the first end N1 of the hole crack detection line HCD, and the second detection receiving line DR2.

The circuit portion 750 determines whether the second closed circuit is normal or not (S207).

When a voltage of the second closed circuit signal is not included in a predetermined reference voltage range or a resistance of the second closed circuit is not included in a reference resistance range, the circuit portion 750 determines that a defect of the second detection line M2 exists (S208). That is, the circuit portion 750 may determine that a crack has occurred at a lower edge, a right edge or an upper edge of the display panel 100D. Meantime, even when the first closed circuit is not normal, the outputting of the second detection signal (S205), the receiving of the second closed circuit signal (S206), the determining whether the second closed circuit is normal (S207), and the determining whether the defect of the second detection line M2 exists (S208) may be further performed as necessary.

When the second closed circuit is normal, the circuit portion 750 outputs the first detection signal to the first detection transfer line DT1 or the second detection signal to the second detection transfer line DT2 (S209). Hereinafter, an example in which the circuit portion 750 outputs the first detection signal to the first detection transfer line DT1 will be described. The first detection signal is transferred to the second end N2 of the hole crack detection line HCD through the first detection transfer line DT1 and to the second detection receiving line DR2 through the hole crack detection line HCD.

The circuit portion 750 receives the first detection signal transferred through the second detection receiving line DR2 as a third closed circuit signal (S210). That is, the circuit portion 750 receives the third closed circuit signal transferred through the third closed circuit formed by the first detection transfer line DT1, the hole crack detection line HCD, and the second detection receiving line DR2. When the circuit portion 750 outputs the second detection signal to the second detection transfer line DT2, the circuit portion 750 may receive a fourth closed circuit signal transferred through the fourth closed circuit formed by the second detection transfer line DT2, the hole crack detection line HCD, and the first detection receiving line DR1.

The circuit portion 750 determines whether the third closed circuit is normal or not (S211). The circuit portion 750 may determine that the third closed circuit is normal when the voltage of the third closed circuit signal is included in a predetermined reference voltage range or a resistance of the third closed circuit is included in a reference resistance range.

When the third closed circuit is normal, the circuit portion 750 determines that the display panel 100D is good (S212). That is, the circuit portion 750 may determine that no crack has occurred in the display panel 100D.

When the third closed circuit is not normal, the circuit portion 750 determines that a hole crack defect exists (S213). That is, when it is determined (measured) that the third closed circuit is defective, the circuit portion 750 may determine a hole crack defect in which a crack has occurred in the hole crack detection line HCD. Alternatively, when the circuit unit 750 receives the fourth closed circuit signal, it is possible to determine whether the display panel 100D is good or determine the hole crack defect depending on whether the fourth closed circuit signal is normal or not.

Except for these differences, the features of the exemplary embodiments described above with reference to FIG. 1 to FIG. 3 may be applied to the exemplary embodiment described with reference to FIG. 7 and FIG. 8, so redundant description is omitted among the exemplary embodiments.

Hereinafter, a display device according to an exemplary embodiment of the present inventive concept will be described with reference to FIG. 9. Differences from the aforementioned exemplary embodiment of FIG. 1 and FIG. 2 will be mainly described.

Figure 9:
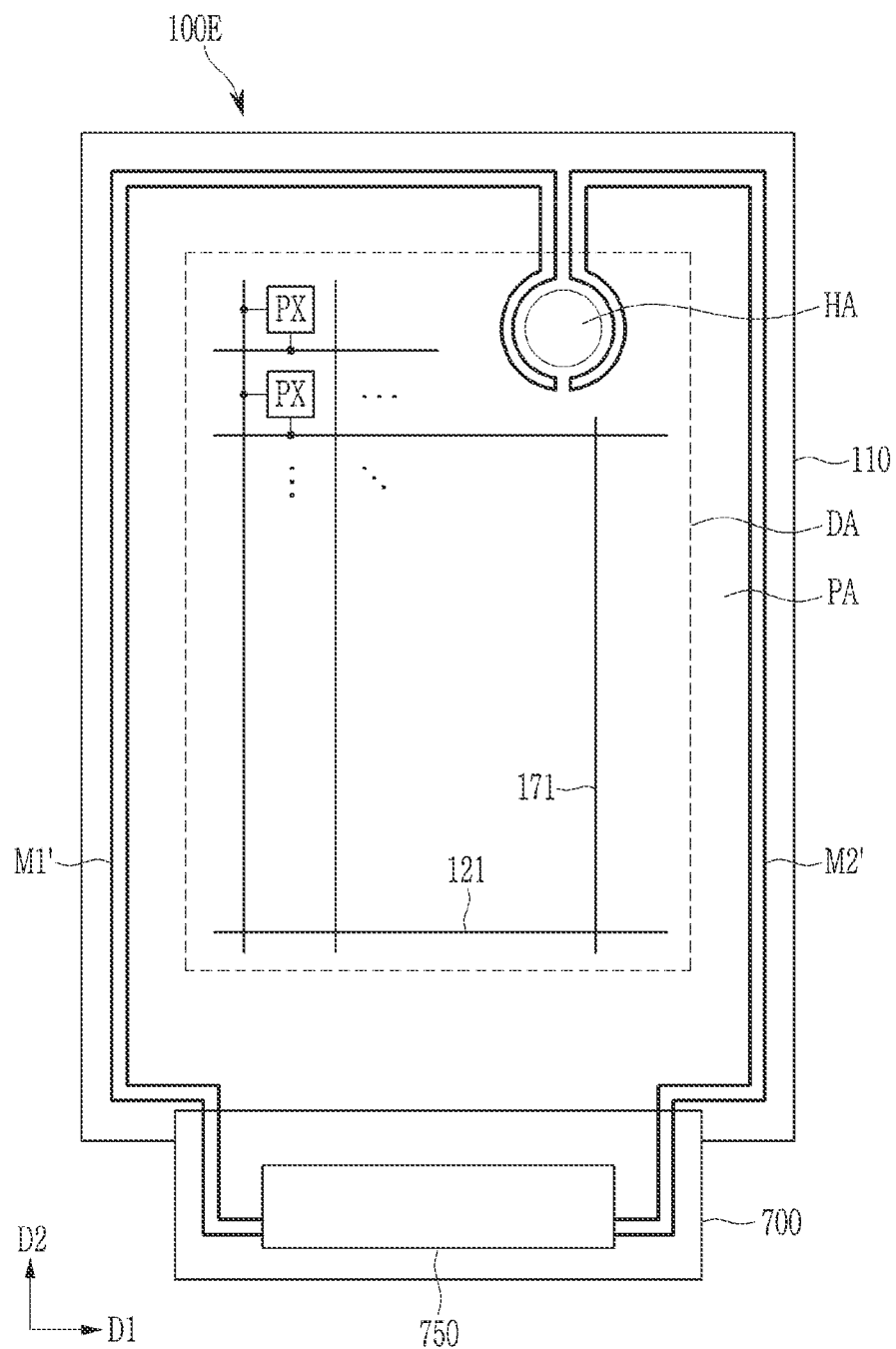
FIG. 9 illustrates a top plan view of a display device according to an exemplary embodiment of the present inventive concept.

FIG. 9 illustrates a top plan view of a display device according to an exemplary embodiment of the present inventive concept.

Referring to FIG. 9, in the display panel 100E according to the present exemplary embodiment, the hole crack detection line HCD may be omitted, and a first detection line M1' and a second detection line M2' each having opposite ends connected to the circuit portion 750 may be disposed to surround the hole area HA.

The opposite ends of the first detection line M1' may be connected to the circuit portion 750 to form the first closed circuit, and the opposite ends of the second detection line M2' may be connected to the circuit portion 750 to form the second closed circuit. The first detection line M1' may be disposed in a closed-circuit shape that extends from the circuit portion 750 toward the display area DA and then extends along a lower edge, a left edge, and an upper edge of the display area DA, and then extends from an upper edge thereof adjacent to the hole area HA toward the display area DA, and extends to surround a left edge of the hole area HA to return in a reverse direction. The second detection line M2' may be disposed in a closed-circuit shape that extends from the circuit portion 750 toward the display area DA and then extends along the lower edge, a right edge, the upper edge of the display area DA, and then extends from an upper edge thereof adjacent to the hole area HA toward the display area DA, and extends to surround a right edge of the hole area HA to return in a reverse direction.

The first detection line M1' and the second detection line M2' may be physically separated from each other, and may face each other with the hole area HA therebetween.

The circuit portion 750 may output the first detection signal to the first detection line M1', and may receive the first detection signal fed back as the first closed circuit signal to inspect crack defects around a lower edge, a left edge and an upper edge of the display panel 100E and a left side of the hole area HA. The circuit portion 750 may output the second detection signal to the second detection line M2', and may receive the second detection signal fed back as the second closed circuit signal to inspect crack defects around a lower edge, a right edge and the upper edge of the display panel 100E and a right side of the hole area HA.

Except for these differences, the features of the exemplary embodiments described above with reference to FIG. 1 and FIG. 2 may be applied to the exemplary embodiment described with reference FIG. 9, so redundant description is omitted among the exemplary embodiments.

Hereinafter, a display device according to an exemplary embodiment of the present inventive concept will be described with reference to FIG. 10. Differences from the aforementioned exemplary embodiment of FIG. 5 and FIG. 6 will mainly be described.

Figure 10:
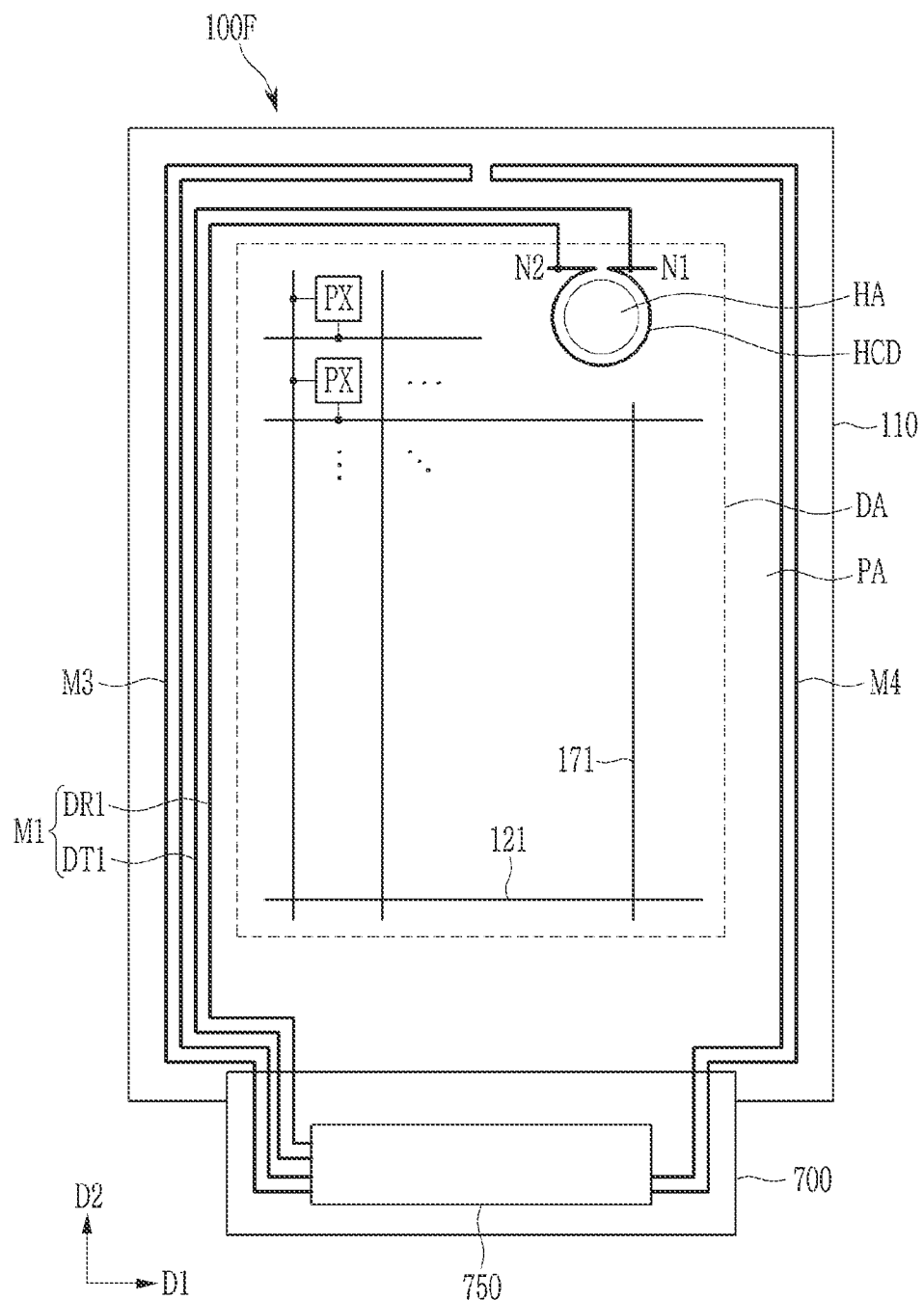
FIG. 10 illustrates a top plan view of a display device according to an exemplary embodiment of the present inventive concept.

FIG. 10 illustrates a top plan view of a display device according to an exemplary embodiment of the present inventive concept.

Referring to FIG. 10, in the display panel 100F according to the present exemplary embodiment, the second detection line M2 is omitted in the display panel 100C of FIG. 5.

In this case, the circuit portion 750 may inspect crack defects at an edge of the display panel 100F by using the third detection line M3 and the fourth detection line M4, and may perform a hole crack defect inspection by using the first detection line M1 and the hole crack detection line HCD. That is, the circuit portion 750 may output the first detection signal to the first detection transfer line DT1, and may inspect a hole crack defect by receiving the first closed circuit signal transferred through the hole crack detection line HCD and the first detection receiving line DR1.

Except for these differences, the features of the exemplary embodiment described above with reference to FIG. 5 and FIG. 6 may be applied to the exemplary embodiment described with reference to FIG. 10, so redundant description is omitted among the exemplary embodiments.

Hereinafter, a display device according to an exemplary embodiment of the present inventive concept will be described with reference to FIG. 11. Differences from the aforementioned exemplary embodiment of FIG. 5 and FIG. 6 will be mainly described.

Figure 11:
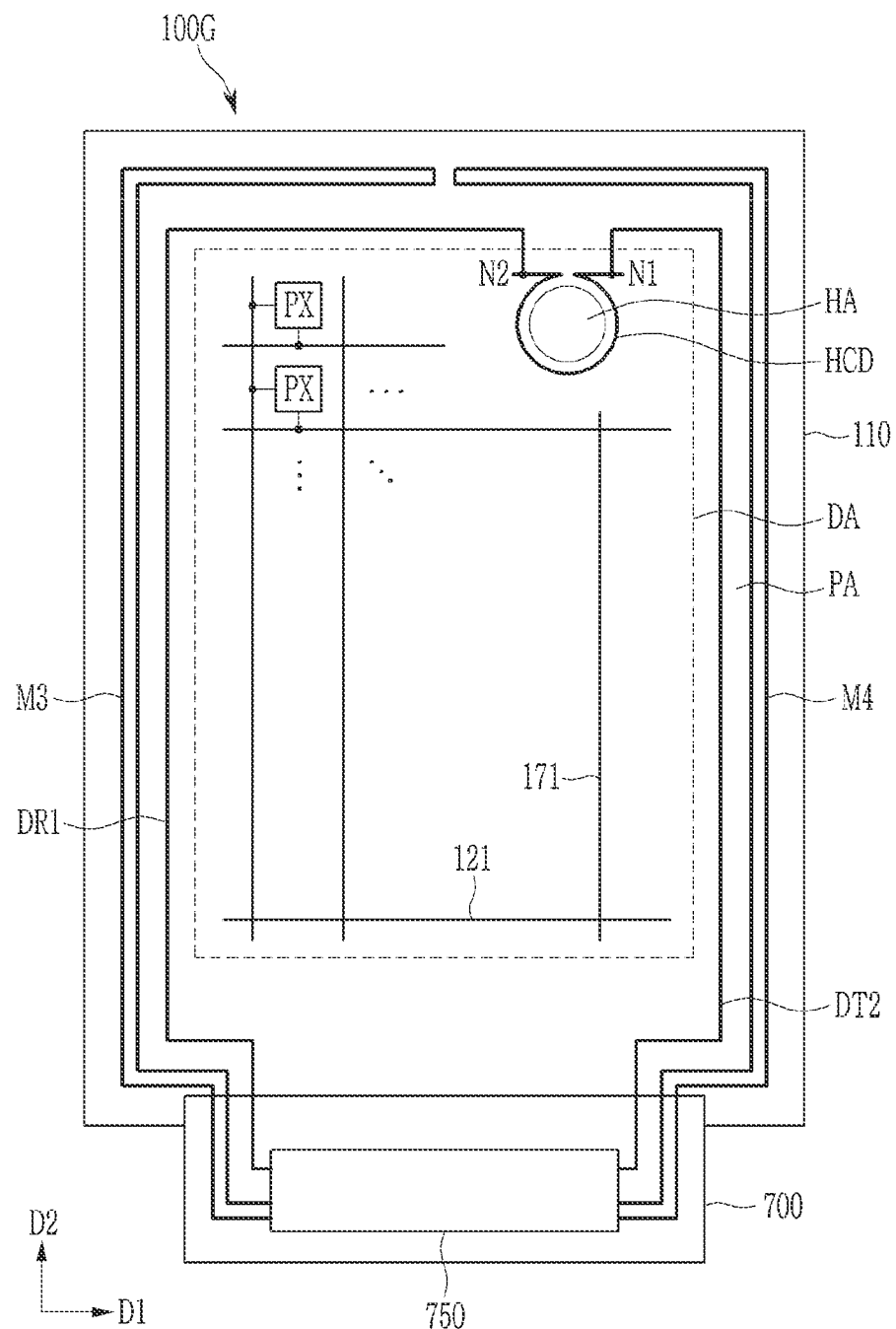
FIG. 11 illustrates a top plan view of a display device according to an exemplary embodiment of the present inventive concept.

FIG. 11 illustrates a top plan view of a display device according to an exemplary embodiment of the present inventive concept.

Referring to FIG. 11, in the display panel 100G according to the present exemplary embodiment, the first detection transfer line DT1 and the second detection receiving line DR2 in the display panel 100C of FIG. 5 are omitted. The second detection transfer line DT2 and the first detection receiving line DR1 constitute a first closed circuit.

In this case, the circuit portion 750 may inspect crack defects at an edge of the display panel 100G by using the third detection line M3 and the fourth detection line M4, and may perform a hole crack defect inspection by using the second detection transfer line DT2 and the first detection receiving line DR1. That is, the circuit portion 750 may output the first detection signal to the second detection transfer line DT2, and may inspect a hole crack defect by receiving the first closed circuit signal transferred through the hole crack detection line HCD and the first detection receiving line DR1.

Except for these differences, the features of the exemplary embodiment described above with reference to FIG. 5 and FIG. 6 may be applied to the exemplary embodiment described with reference to FIG. 11, so redundant description is omitted among the exemplary embodiments.

Hereinafter, a case in which the circuit portion 750 is disposed in the peripheral area PA of the display panel will be described with reference to FIG. 12 to FIG. 18. Differences from the display device according to the aforementioned exemplary embodiments will be mainly described.

Figure 12:
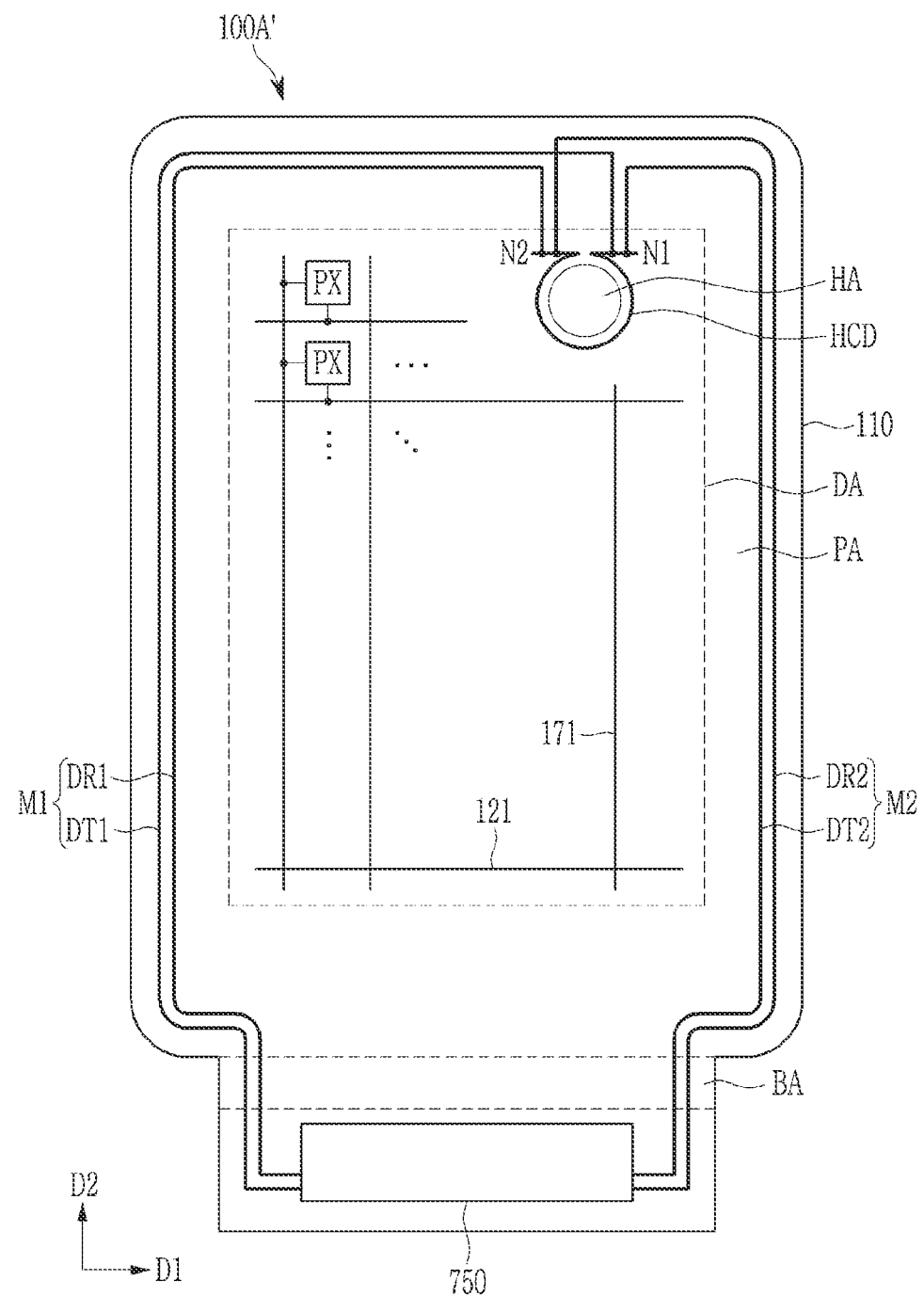
FIG. 12 illustrates a top plan view of a display device according to an exemplary embodiment of the present inventive concept.

FIG. 12 illustrates a top plan view of a display device according to an exemplary embodiment of the present inventive concept.

Referring to FIG. 12, the circuit portion 750 may be disposed in the peripheral area PA on the substrate 110 instead of being disposed on the printed circuit film 700 described with reference to FIG. 1. The circuit portion 750 may be directly mounted on the peripheral area PA, or may be formed directly on the substrate 110 together with constituent elements such as transistors of the pixel PX.

In this case, the substrate 110 may include a bending area BA disposed between the display area DA and the circuit portion 750. The bending area BA may be an area where the display panel 100A' can be bent rearward or frontward. The peripheral area PA where the circuit portion 750 is disposed may be folded to a rear surface of the display panel 100A'.

The first detection transfer line DT1, the first detection receiving line DR1, the second detection transfer line DT2, and the second detection receiving line DR2 may extend from the circuit portion 750 along an edge of the display area DA through bending area BA on the substrate 110.

Further, some of edges of the substrate 110 may be rounded, and bent portions of the first detection transfer line DT1, the first detection receiving line DR1, the second detection transfer line DT2, and the second detection receiving line DR2 may be rounded.

Except for these features, the features of the exemplary embodiments described above with reference to FIG. 1 to FIG. 3 may be applied to the exemplary embodiment described with reference to FIG. 12, so redundant description is omitted among the exemplary embodiments.

Figure 13:
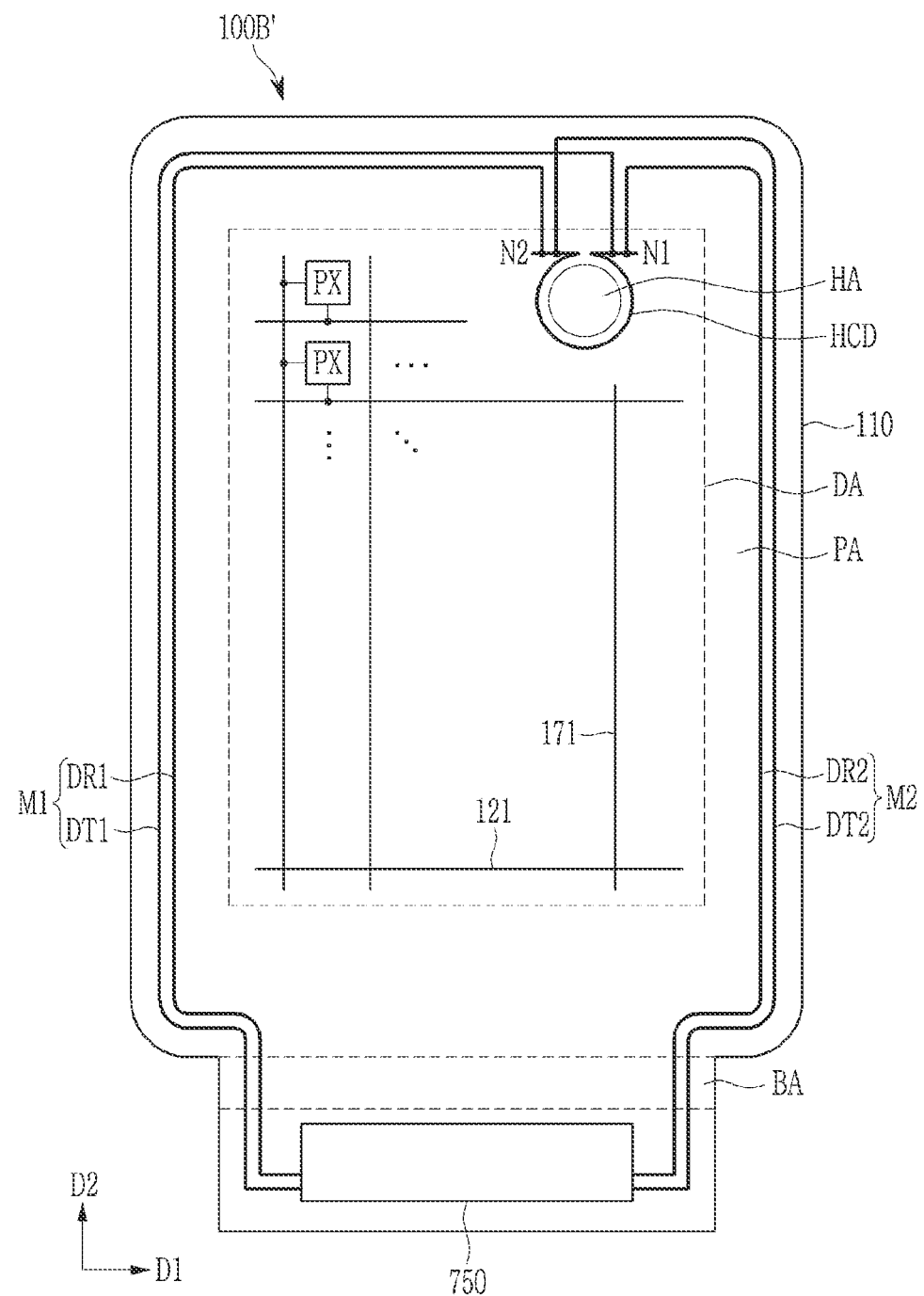
FIG. 13 illustrates a top plan view of a display device according to an exemplary embodiment of the present inventive concept.

FIG. 13 illustrates a top plan view of a display device according to an exemplary embodiment of the present inventive concept.

The display panel 100B' of FIG. 13 may include all of the features of the exemplary embodiment described above with reference to FIG. 4, FIG. 12, and FIG. 1 to FIG. 3, and thus duplicate descriptions of the exemplary embodiment will be omitted.

Figure 14:
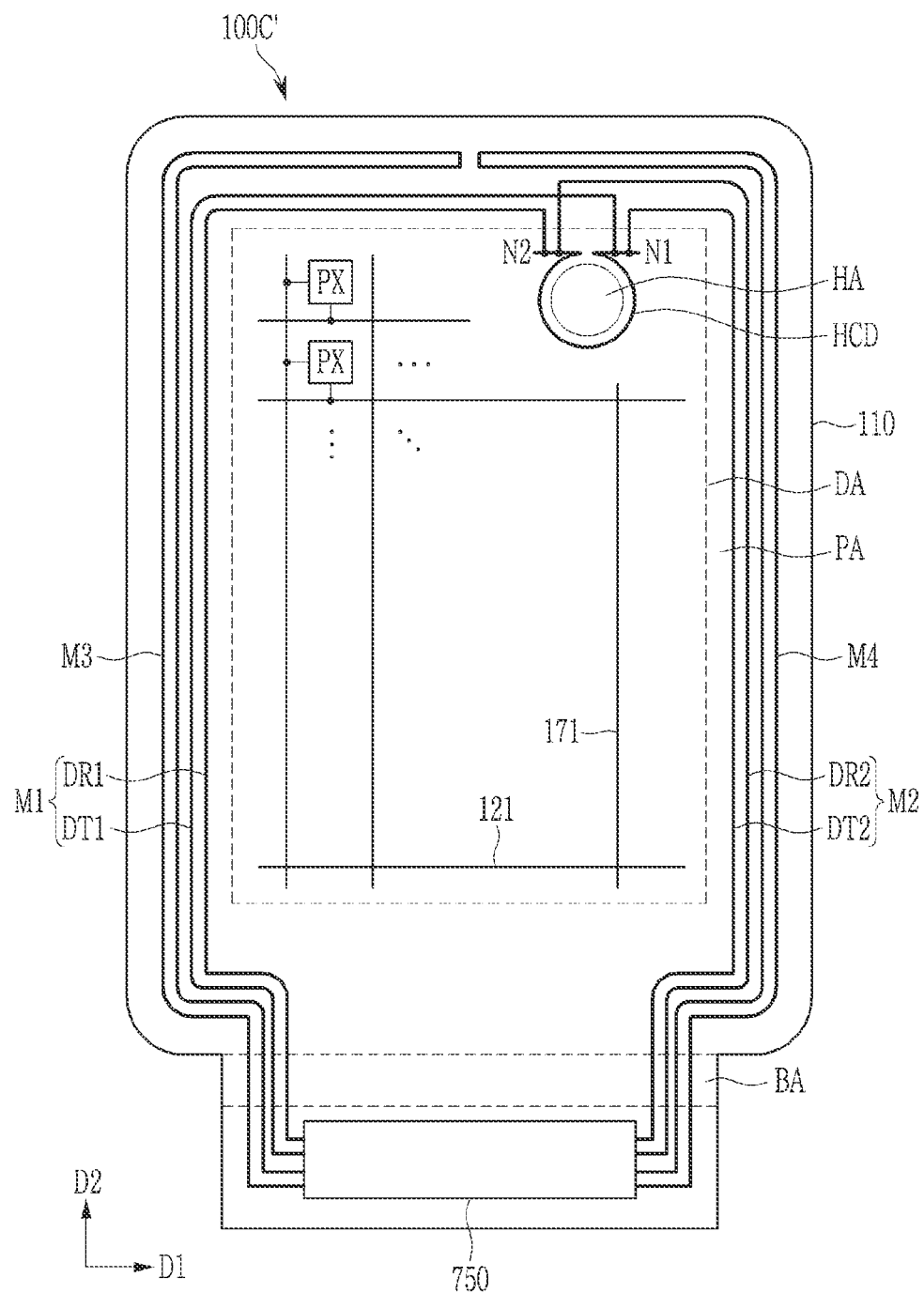
FIG. 14 illustrates a top plan view of a display device according to an exemplary embodiment of the present inventive concept.

FIG. 14 illustrates a top plan view of a display device according to an exemplary embodiment of the present inventive concept.

Referring to FIG. 14, the third detection line M3 and the fourth detection line M4 may extend from the circuit portion 750 along the edge of the display area DA through the bending area BA on the substrate 110. The bent portions of the third detection line M3 and the fourth detection line M4 may be rounded depending on an edge shape of the substrate 110.

The display panel 100C' of FIG. 14 may include all of the features of the exemplary embodiments described above with reference to FIG. 5 and FIG. 6, FIG. 12, and FIG. 1 to FIG. 3, and thus duplicate descriptions of the exemplary embodiment will be omitted.

Figure 15:
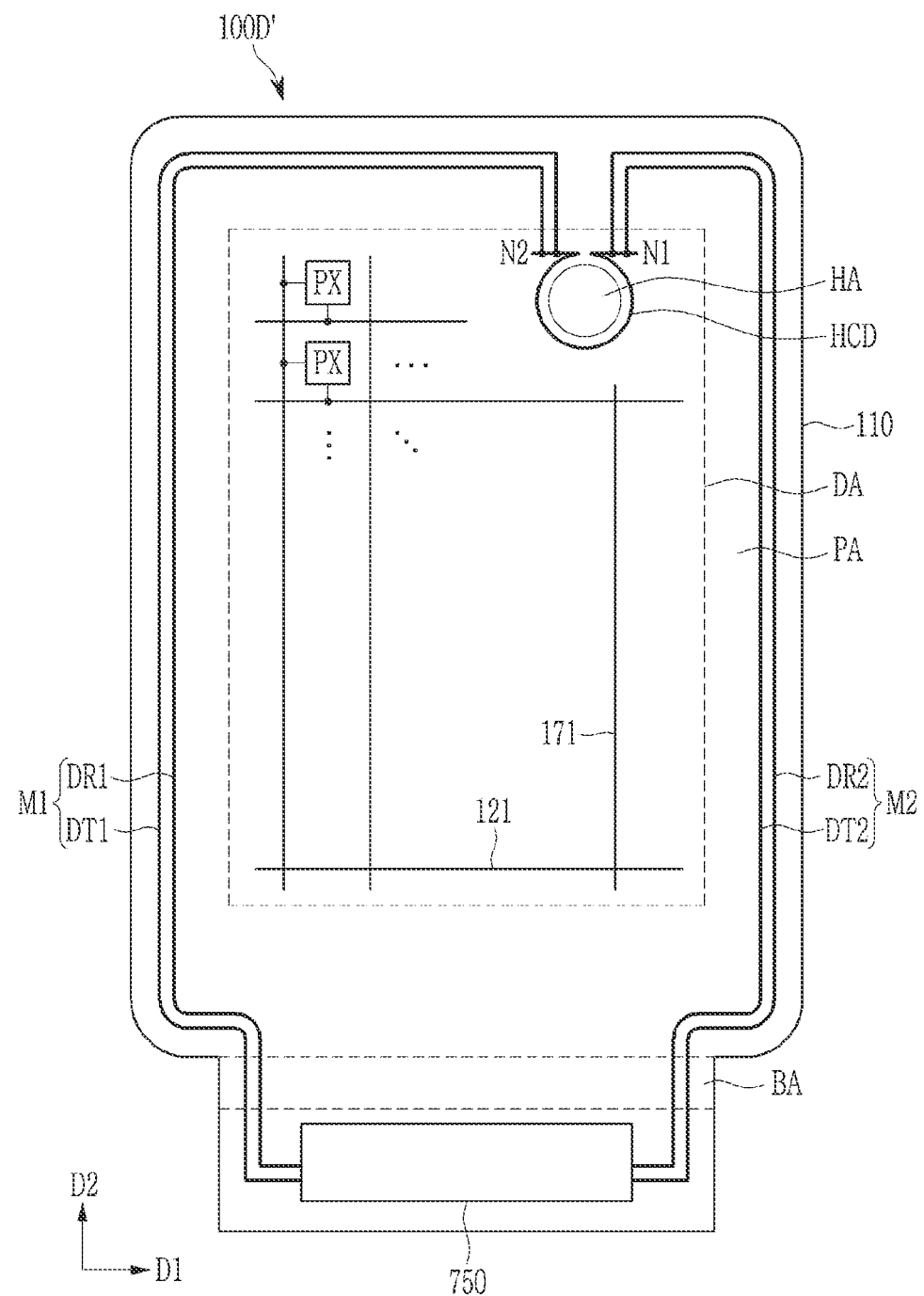
FIG. 15 illustrates a top plan view of a display device according to an exemplary embodiment of the present inventive concept.

FIG. 15 illustrates a top plan view of a display device according to an exemplary embodiment of the present inventive concept.

The display panel 100D' of FIG. 15 may include all of the features of the exemplary embodiments described above with reference to FIG. 7 and FIG. 8, FIG. 12, and FIG. 1 to FIG. 3, and thus duplicate descriptions of the exemplary embodiment will be omitted.

Figure 16:
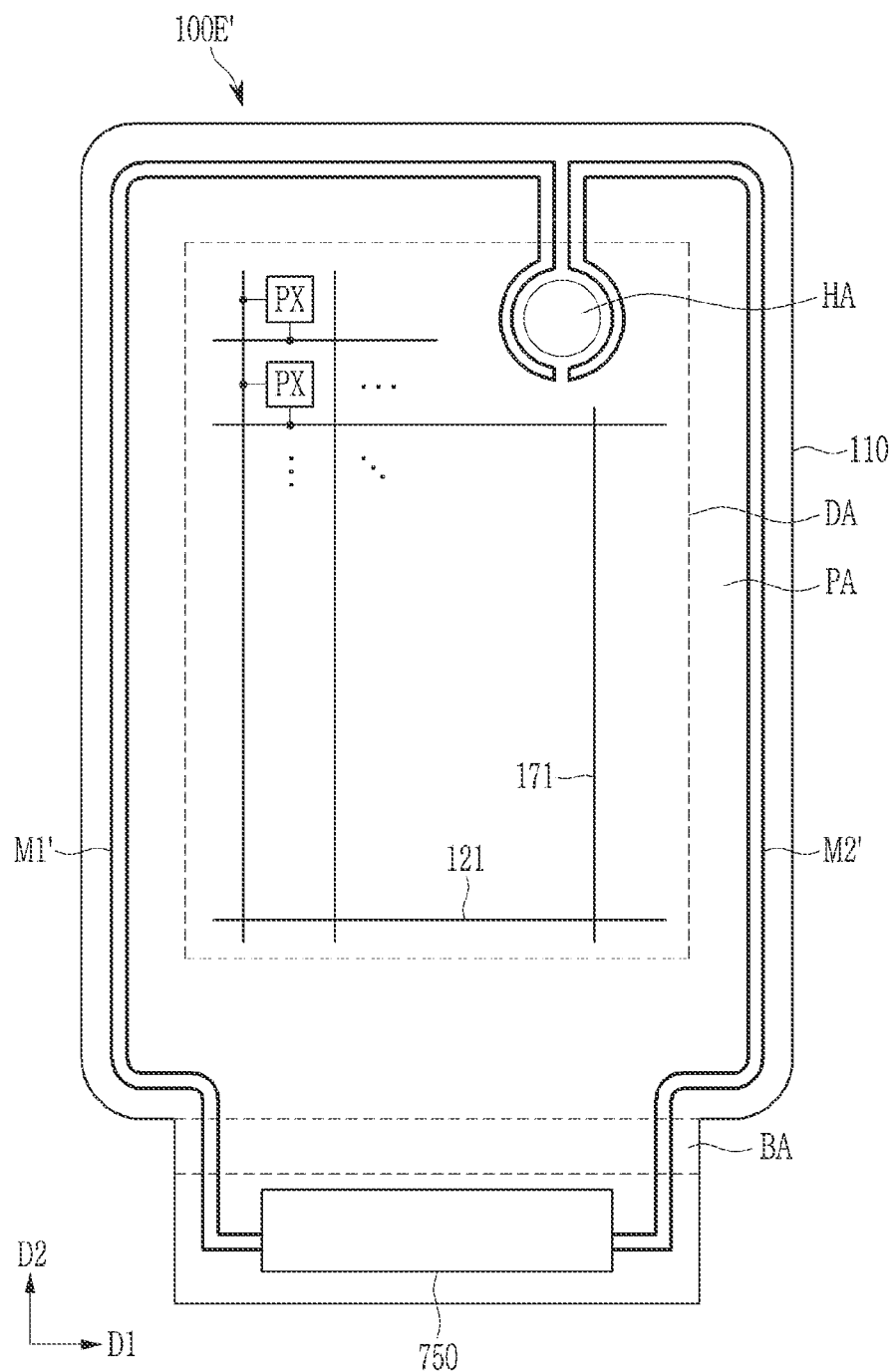
FIG. 16 illustrates a top plan view of a display device according to an exemplary embodiment of the present inventive concept.

FIG. 16 illustrates a top plan view of a display device according to an exemplary embodiment of the present inventive concept.

Referring to FIG. 16, the first detection line M1' and the second detection line M2' may extend from the circuit portion 750 along the edge of the display area DA through the bending area BA on the substrate 110. The bent portions of the first detection line M1' and the second detection line M2' may be rounded depending on an edge shape of the substrate 110.

The display panel 100E' of FIG. 16 may include all of the features of the exemplary embodiments described above with reference to FIG. 9, FIG. 12, and FIG. 1 and FIG. 2, and thus duplicate descriptions of the exemplary embodiment will be omitted.

Figure 17:
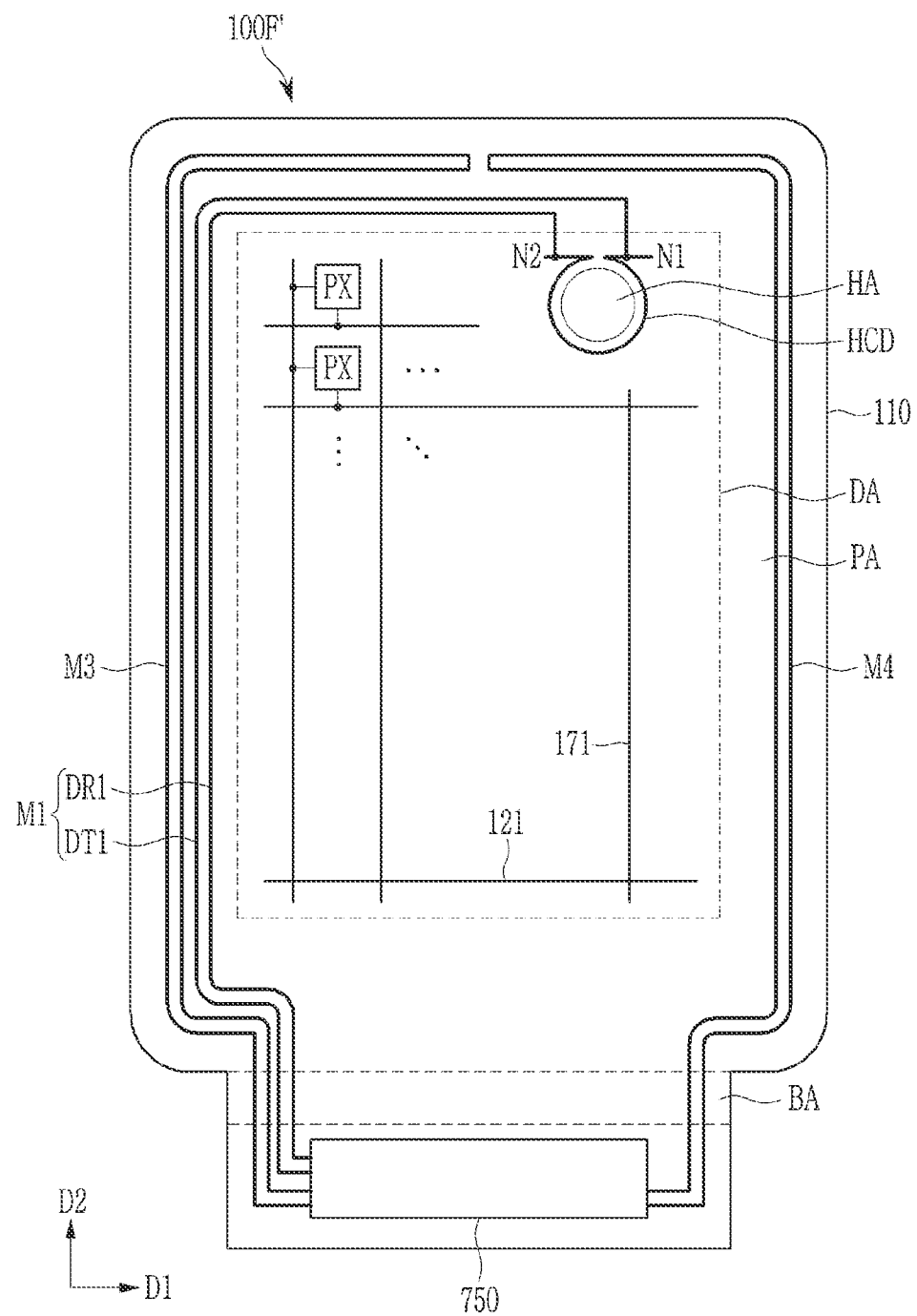
FIG. 17 illustrates a top plan view of a display device according to an exemplary embodiment of the present inventive concept.

FIG. 17 illustrates a top plan view of a display device according to an exemplary embodiment of the present inventive concept.

Referring to FIG. 17, the first detection line M1, the third detection line M3, and the fourth detection line M4 may extend from the circuit portion 750 along the edge of the display area DA through the bending area BA on the substrate 110. The bent portions of the first detection line M1, the third detection line M3, and the fourth detection line M4 may be rounded depending on an edge shape of the substrate 110.

The display panel 100F' of FIG. 17 may include all of the features of the exemplary embodiments described above with reference to FIG. 10, FIG. 12, and FIG. 5 and FIG. 6, and thus duplicate descriptions of the exemplary embodiment will be omitted.

Figure 18:
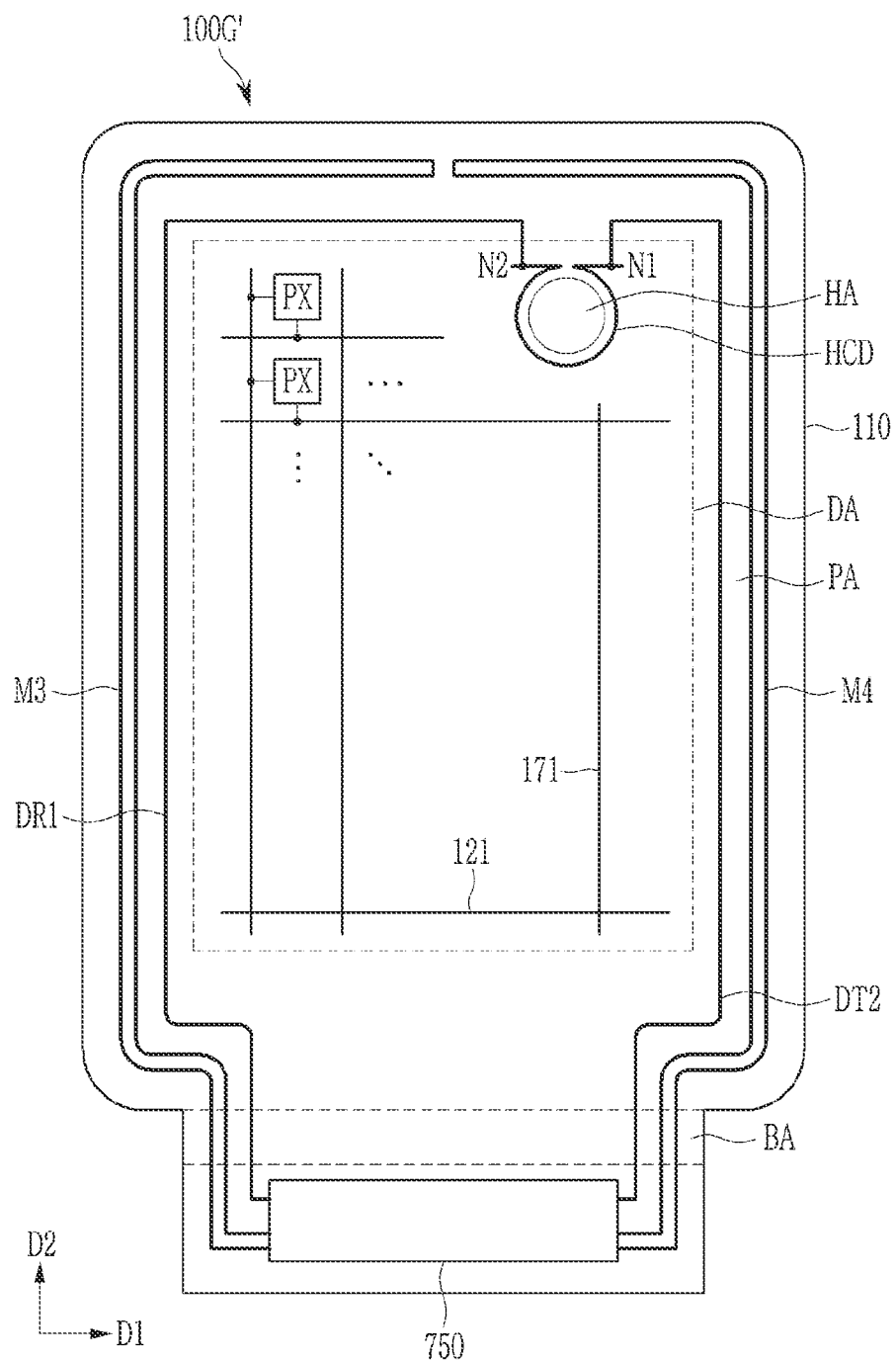
FIG. 18 illustrates a top plan view of a display device according to an exemplary embodiment of the present inventive concept.

FIG. 18 illustrates a top plan view of a display device according to an exemplary embodiment of the present inventive concept.

Referring to FIG. 18, the second detection transfer line DT2, the first detection receiving line DR1, the third detection line M3, and the fourth detection line M4 may extend from the circuit portion 750 along the edge of the display area DA through the bending area BA on the substrate 110. The bent portions of the second detection transfer line DT2, the first detection receiving line DR1, the third detection line M3, and the fourth detection line M4 may be rounded depending on an edge shape of the substrate 110.

The display panel 100G' of FIG. 18 may include all of the features of the exemplary embodiments described above with reference to FIG. 11, FIG. 12, and FIG. 5 and FIG. 6, and thus duplicate descriptions of the exemplary embodiment will be omitted.

While exemplary embodiments of the present inventive concept have been particularly shown and described with reference to the accompanying drawings, the specific terms used herein are only for the purpose of describing the inventive concept and are not intended to define the meanings thereof or be limiting of the scope of the inventive concept set forth in the claims. Therefore, those skilled in the art will understand that various modifications and other equivalent embodiments of the present inventive concept are possible. Consequently, the true technical protective scope of the present inventive concept must be determined based on the technical spirit of the appended claims.

What is claimed is:

1. A display device comprising:
   a display area where an image is displayed;
   a peripheral area surrounding the display area;
   a non-display area at least partially surrounded by the display area;
   a crack detection line disposed adjacent to the non-display area to surround at least a portion of the non-display area and having a first end and a second end that is separated from the first end;
   a first detection line extending from the peripheral area and connected to the crack detection line;

a second detection line extending from the peripheral area and connected to the crack detection line; and a circuit portion connected to the first detection line and the second detection line and detecting crack defects at the peripheral area and the non-display area based on signals from the first detection line and the second detection line.

2. The display device of claim 1, wherein the first detection line includes:

a first detection transfer line having a first end connected to the circuit portion and a second end connected to the first end of the crack detection line; and a first detection receiving line having a first end connected to the circuit portion and a second end connected to the second end of the crack detection line, and wherein the second detection line includes:

a second detection transfer line having a first end connected to the circuit portion and a second end connected to the first end of the crack detection line, and a second detection receiving line having a first end connected to the circuit portion and a second end connected to the second end of the crack detection line.

3. The display device of claim 2, wherein the first detection transfer line, the crack detection line, and the first detection receiving line constitute a first closed circuit and the second detection transfer line, the crack detection line, and the second detection receiving line constitute a second closed circuit.

4. The display device of claim 3, wherein the circuit portion determines that a crack defect exists when both the first closed circuit and the second closed circuit are determined to be defective based on the signals from the first detection receiving line and the second detection receiving line.

5. The display device of claim 1, wherein the first detection line includes:

a first detection transfer line having a first end connected to the circuit portion and a second end connected to the first end of the crack detection line; and a first detection receiving line having a first end connected to the circuit portion and a second end connected to the second end of the crack detection line, and wherein the second detection line includes:

a second detection transfer line having a first end connected to the circuit portion and a second end connected to the second end of the crack detection line, and a second detection receiving line having a first end connected to the circuit portion and a second end connected to the first end of the crack detection line.

6. The display device of claim 1, further comprising:

a third detection line extending in parallel with the first detection line in the peripheral area and having opposite ends that are connected to the circuit portion; and a fourth detection line extending in parallel with the second detection line in the peripheral area and having opposite ends that are connected to the circuit portion.

7. The display device of claim 1, wherein the first detection line includes:

a first detection transfer line having a first end connected to the circuit portion and a second end connected to the second end of the crack detection line; and a first detection receiving line having a first end connected to the circuit portion and a second end connected to the second end of the crack detection line, and wherein the second detection line includes:

a second detection transfer line having a first end connected to the circuit portion and a second end connected to the first end of the crack detection line; and a second detection receiving line having a first end connected to the circuit portion and a second end connected to the first end of the crack detection line.

8. The display device of claim 7, wherein the first detection transfer line and the first detection receiving line constitute a first closed circuit and the second detection transfer line and the second detection receiving line constitute a second closed circuit.

9. The display device of claim 8, wherein the first detection transfer line, the crack detection line, and the second detection receiving line constitute a third closed circuit.

10. The display device of claim 9, wherein the circuit portion determines that a crack defect exists at the non-display area when the third closed circuit is determined to be defective based on a signal from the second detection receiving line.

11. A display device comprising:

a substrate including a display area where an image is displayed and a peripheral area surrounding the display area;

a non-display area at least partially surrounded by the display area;

a first detection line extending along a first edge of the display area in the peripheral area and extending to surround a first edge of the non-display area, the first detection line including at least first two lines extending substantially parallel to each other and ends of the at least first two lines being connected to each other in a first region adjacent to the non-display area;

a second detection line extending along a second edge of the display area in the peripheral area and extending to surround a second edge of the non-display area opposing the first edge of the non-display area, the second detection line including at least second two lines extending substantially parallel to each other and ends of the at least second two lines being connected to each other in a second region adjacent to the non-display area; and a circuit portion connected to opposite ends of the first detection line and opposite ends of the second detection line and configured to determine that crack defects exist at the peripheral area and the non-display area based on signals from the first second detection line and the second detection line.

12. The display device of claim 11, wherein the non-display area is a region where a hole is formed by removing a substrate.

13. The display device of claim 11, wherein the first detection line and the second detection line are physically separated and face each other with the non-display area interposed therebetween.

14. The display device of claim 11, wherein the circuit portion inspects a crack defect at the first edge of the non-display area by outputting a first detection signal to the first detection line and receiving a first signal that is fed back, and inspects a crack defect at the second edge of the non-display area by outputting a second detection signal to the second detection line and receiving a second signal that is fed back.

15. An inspecting method of a display device, the method comprising:

outputting a first detection signal to a first detection line connected to a crack detection line, the crack detection line being disposed adjacent to a non-display area surrounded by a display area;

receiving a first signal corresponding to the first detection signal;

outputting a second detection signal to a second detection line connected to the crack detection line;

receiving a second signal corresponding to the second detection signal; and detecting crack defects at the peripheral area and the non-display area based on the first signal and the second signal.

16. The inspecting method of claim 15, wherein the detecting crack defects includes:

determining that crack defects exist at the non-display area when both of the first signal and the second signal are abnormal.

17. The inspecting method of claim 15, wherein the first detection line includes:

a first detection transfer line having a first end connected to the circuit portion and a second end connected to a first end of the crack detection line; and a first detection receiving line having a first end connected to the circuit portion and a second end connected to a second end of the crack detection line, wherein the second detection line includes:

a second detection transfer line having a first end connected to the circuit portion and a second end connected to the first end of the crack detection line; and a second detection receiving line having a first end connected to the circuit portion and a second end connected to the second end of the crack detection line, and wherein the first detection transfer line, the crack detection line, and the first detection receiving line constitute a first closed circuit, and the second detection transfer line, the crack detection line, and the second detection receiving line constitute a second closed circuit.

18. The inspecting method of claim 17, wherein the receiving a first signal includes receiving the first signal from the first detection transfer line, and the receiving a second signal includes receiving the second signal from the second detection transfer line.

19. The inspecting method of claim 15, wherein the first detection line includes:

a first detection transfer line having a first end connected to the circuit portion and a second end connected to the second end of the crack detection line; and a first detection receiving line having a first end connected to the circuit portion and a second end connected to the second end of the crack detection line, wherein the second detection line includes:

a second detection transfer line having a first end connected to the circuit portion and a second end connected to the first end of the crack detection line; and a second detection receiving line having a first end connected to the circuit portion and a second end connected to the first end of the crack detection line, and wherein the first detection transfer line, the crack detection line, and the second detection receiving line constitute a third closed circuit.

20. The inspecting method of claim 19, further comprising:

outputting a third detection signal to the first detection transfer line;

receiving a third signal from the second detection receiving line; and detecting a crack defect at the non-display area based on the third signal.

* * * * *